United States Patent
Koike et al.

(10) Patent No.: US 10,796,995 B2
(45) Date of Patent: Oct. 6, 2020

(54) SEMICONDUCTOR DEVICES INCLUDING A FIRST COBALT ALLOY IN A FIRST BARRIER LAYER AND A SECOND COBALT ALLOY IN A SECOND BARRIER LAYER

(71) Applicant: TOHOKU UNIVERSITY, Sendai-shi, Miyagi (JP)

(72) Inventors: Junichi Koike, Sendai (JP); Reza Arghavani, Scotts Valley, CA (US)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 0 days.

(21) Appl. No.: 15/825,833

(22) Filed: Nov. 29, 2017

(65) Prior Publication Data

US 2019/0164896 A1    May 30, 2019

(51) Int. Cl.
| | |
|---|---|
| *H01L 23/532* | (2006.01) |
| *H01L 23/522* | (2006.01) |
| *H01L 23/528* | (2006.01) |
| *H01L 23/485* | (2006.01) |
| *H01L 21/8238* | (2006.01) |
| *H01L 21/768* | (2006.01) |

(Continued)

(52) U.S. Cl.
CPC .. *H01L 23/53228* (2013.01); *H01L 21/76841* (2013.01); *H01L 21/76895* (2013.01); *H01L 21/823821* (2013.01); *H01L 23/485* (2013.01); *H01L 23/528* (2013.01); *H01L 23/5226* (2013.01); *H01L 27/11524* (2013.01); *H01L 27/11529* (2013.01); *H01L 27/11551* (2013.01); *H01L 29/41791* (2013.01); *H01L 29/456* (2013.01); *H01L 29/785* (2013.01); *H01L 29/7851* (2013.01); *H01L 27/11556* (2013.01); *H01L 27/11582* (2013.01); *H01L 2924/01027* (2013.01); *H01L 2924/01029* (2013.01)

(58) Field of Classification Search
CPC ..... H01L 23/53238; H01L 2924/01029; H01L 23/5226; H01L 2224/05647; H01L 2224/45147; H01L 2224/05147; H01L 2924/01027; H01L 2224/13147; H01L 2224/05157; H01L 23/53228
See application file for complete search history.

(56) References Cited

U.S. PATENT DOCUMENTS

| | | | |
|---|---|---|---|
| 6,271,122 B1 * | 8/2001 | Wieczorek | H01L 21/28518 257/E21.165 |
| 6,288,430 B1 * | 9/2001 | Oda | H01L 21/28518 257/382 |

(Continued)

OTHER PUBLICATIONS

Hosseini et al., "Amorphous Co—Ti alloy as a single layer barrier for Co local interconnect structure", presented at International Interconnect Technology Conference held in San Jose, CA, on May 25, 2016 (IEEE 2016), 3 pages.

(Continued)

*Primary Examiner* — Dung A. Le
(74) *Attorney, Agent, or Firm* — Sughrue Mion, PLLC

(57) ABSTRACT

A semiconductor device includes a substrate, a conductive wiring which comprises cobalt or copper and is electrically connected to the substrate, an insulating material which electrically isolates the conductive wiring from neighboring wiring, and a first barrier layer which comprises a first cobalt alloy and is disposed between the conductive wiring and the insulating material.

17 Claims, 18 Drawing Sheets

(51) Int. Cl.

| | |
|---|---|
| H01L 27/11524 | (2017.01) |
| H01L 27/11551 | (2017.01) |
| H01L 27/11529 | (2017.01) |
| H01L 29/417 | (2006.01) |
| H01L 29/78 | (2006.01) |
| H01L 29/45 | (2006.01) |
| H01L 27/11556 | (2017.01) |
| H01L 27/11582 | (2017.01) |

(56) References Cited

U.S. PATENT DOCUMENTS

| | | | | |
|---|---|---|---|---|
| 7,569,457 | B2 * | 8/2009 | Fukada | H01L 21/2652 |
| | | | | 438/303 |
| 2009/0206484 | A1 * | 8/2009 | Baker-O'Neal | |
| | | | | H01L 21/76873 |
| | | | | 257/751 |
| 2010/0167526 | A1 * | 7/2010 | Fu | H01L 21/76838 |
| | | | | 438/643 |
| 2011/0127673 | A1 * | 6/2011 | Anderson | H01L 21/76883 |
| | | | | 257/751 |
| 2013/0193577 | A1 * | 8/2013 | Tseng | H01L 23/485 |
| | | | | 257/751 |
| 2016/0133525 | A1 * | 5/2016 | Lee | H01L 29/665 |
| | | | | 438/589 |
| 2016/0336179 | A1 * | 11/2016 | Mizutani | H01L 21/288 |
| 2017/0040343 | A1 * | 2/2017 | Hsin | H01L 27/124 |
| 2017/0309819 | A1 * | 10/2017 | Wu | H01L 45/146 |
| 2018/0122698 | A1 * | 5/2018 | Zhang | H01L 21/76828 |
| 2018/0138076 | A1 * | 5/2018 | Yang | H01L 21/7682 |
| 2018/0315647 | A1 * | 11/2018 | Wang | H01L 21/76802 |
| 2018/0315704 | A1 * | 11/2018 | Chen | H01L 23/5226 |
| 2018/0337280 | A1 * | 11/2018 | Zhao | H01L 29/456 |
| 2018/0374749 | A1 * | 12/2018 | Wong | H01L 21/76889 |
| 2019/0006303 | A1 * | 1/2019 | Wu | H01L 24/13 |
| 2019/0051600 | A1 * | 2/2019 | Oh | H01L 23/5283 |
| 2019/0067093 | A1 * | 2/2019 | Chang | H01L 21/76846 |
| 2019/0081233 | A1 * | 3/2019 | Lee | H01L 43/02 |
| 2019/0088500 | A1 * | 3/2019 | Lin | H01L 21/32055 |
| 2019/0096842 | A1 * | 3/2019 | Fountain, Jr. | H01L 24/27 |

OTHER PUBLICATIONS

Hosseini et al., "Metallurgical and electrical characterization of ultrathin $CoTi_x$ liner/barrier for Cu interconnects", presented on May 17, 2017 at International Interconnect Technology Conference held in Hsinchu, Taiwan (paper distributed on May 16, 2017), 3 pages.

Koike et al., "Co—Ti alloy for a barrier and contact material in advanced MOL", presented at Advanced Metallization Conference held in Austin, TX, on Sep. 13, 2017, 3 pages (distributed to approximately 50 conference registrants in the form of a USB; presentation form was a poster, which was not distributed).

Junichi Koike, "Co—Ti alloy for a barrier and contact material in advanced MOL", presented at Advanced Metallization Conference held in Austin, TX, on Sep. 13, 2017, 26 pages.

Hosseini et al., "Co/Si contact properties with an amorphous interlayer of $CoTi_x$", presented at Advanced Metallization Conference, Asian Session, held in Tokyo, JP, on Oct. 19, 2017, 2 pages (distributed to approximately 80 conference registrants in the form of a USB; presentation form was PowerPoint slides, which were not distributed).

* cited by examiner

| Element | $r_0$ at RT (mΩcm) | l (nm) | $r_0 l$ ($10^{-16}$ Ωm²) | $D_0$ (cm²/s) | Q (kJ/mol) | D at 400 °C (cm²/s) | $T_M$ (°C) | Silicide Formation Temp. |
|---|---|---|---|---|---|---|---|---|
| Cu | 1.678 | 39.9 | 6.70 | 0.2 | 197.3 | 9.15E-17 | 1085 | Low |
| Ag | 1.587 | 53.3 | 8.46 | 0.395 | 184.6 | 1.75E-15 | 962 | None |
| Al | 2.650 | 18.9 | 5.01 | 1.71 | 142.4 | 1.45E-11 | 660 | None |
| Rh | 4.7 | 6.88 | 3.23 | 3.3 | 242.8 | 4.38E-19 | 1964 | Low |
| Ir | 5.2 | 7.09 | 3.69 | 0.36 | 438.8 | 2.76E-35 | 2446 | High |
| W | 5.28 | 15.5 | 8.20 | 1.88 | 587.4 | 4.03E-46 | 3400 | High |
| Mo | 5.34 | 11.2 | 5.99 | 5.7 | 481.5 | 2.09E-37 | 2620 | High |
| Co | 6.2 | 11.8/7.77 | 7.31/4.82 (6.1) | 0.37 | 280.5 | 5.75E-23 | 1495 | Middle |
| Ni | 6.93 | 5.87 | 4.07 | 1.27 | 279.7 | 2.28E-22 | 1455 | Middle |
| Ru | 7.8 | 6.59/4.88 | 5.14/3.81 (4.47) | 8.5 | 257.5 | 8.11E-20 | 2250 | Low |
| Ta | 13.5 | 3.81 | 5.14 | 1.16 | 461.5 | 1.53E-36 | 3011 | High |
| Ti | 54 | 0.83 | 4.48 | 3.5 | 328.3 | 1.05E-25 | 1668 | High |
| TaN | 100-500 | 5.5-2.5 | 55 – 125 | | | | 2980 - 3360 | High |
| TiN | 13 - 130 | 45 | 7.15 – 11.1 | | | | 2900 - 3220 | High |

Figure 8

SEMICONDUCTOR DEVICES INCLUDING A FIRST COBALT ALLOY IN A FIRST BARRIER LAYER AND A SECOND COBALT ALLOY IN A SECOND BARRIER LAYER

FIELD

The present disclosure relates generally to semiconductor devices and fabrication methods thereof, and more particularly, to a new family of devices that utilize cobalt based metal alloys and methods of making the same.

BACKGROUND

In logic technology, superior electrical performance of a three-dimensional (3-D) Tri-Gate or Fin Field-Effect Transistor (FinFET) has allowed scaling of logic technology to 10 nm node in manufacturing, 7-5 nm node in development and 3 nm node in research and development. FinFET based processors and devices are in production at both 22 nm and 14 nm node technology. At 10 nm node technology, reported die areas are around 7.6 mm$^2$ due to aggressive scaling of transistor and interconnect line dimensions. Such aggressive geometry scaling creates two bottlenecks toward further scaling of technology nodes: (1) a significant increase in Back-End-of-Line (BEOL) and Middle-of-Line (MOL) interconnect line and vertical interconnect access (VIA or via) resistance of metallization processing, thus increasing the Resistive-Capacitive (RC) signal delay of wires or circuits; and (2) a significant increase of transistor Extrinsic Resistance (also called R-External), where access to transistor is resistive. Therefore, there is a demand of low resistance contact via in the aggressively miniaturized devices.

SUMMARY

To meet the above-mentioned demand, various embodiments are provided, including the following.

A first embodiment is a semiconductor device, comprising:
a substrate;
a conductive wiring which comprises cobalt or copper and is electrically connected to the substrate;
an insulating material which electrically isolates the conductive wiring from neighboring wiring; and
a first barrier layer which comprises a first cobalt alloy and is disposed between the conductive wiring and the insulating material.

A second embodiment is the semiconductor device according to the first embodiment, wherein the conductive wiring comprises cobalt.

A third embodiment is the semiconductor device according to the second embodiment, further comprising a second barrier layer which includes a second cobalt alloy and is disposed between the conductive wiring and the substrate.

A fourth embodiment is the semiconductor device according to the second embodiment, wherein the cobalt alloy comprises cobalt and at least one of hafnium (Hf), tantalum (Ta) and titanium (Ti).

A fifth embodiment is the semiconductor device according to the second embodiment, wherein at least one of the first barrier layer and the second barrier layer comprises an amorphous structure.

A sixth embodiment is the semiconductor device according to the second embodiment, wherein at least one of the first barrier layer and the second barrier layer further comprises at least one of silicon (Si), carbon (C), nitrogen (N) and oxygen (O).

A seventh embodiment is the semiconductor device according to the second embodiment, wherein:
the first barrier layer comprises at least one of hafnium (Hf), tantalum (Ta) and titanium (Ti) and at least one of silicon (Si), carbon (C), nitrogen (N) and oxygen (O), and the second barrier layer comprises cobalt and at least one of silicon, SiGe, SiC and InGaAs.

An eighth embodiment is the semiconductor device according to the third embodiment, wherein the second barrier layer is formed of cobalt silicide having a crystalline structure and an epitaxial crystallographic relationship to the substrate.

A ninth embodiment is the semiconductor device according to the second embodiment, wherein a thickness of the first barrier layer ranges from 1 nm to 30 nm.

A tenth embodiment is the semiconductor device according to the second embodiment, wherein the second barrier layer comprises at least one of hafnium oxide, tantalum oxide and titanium oxide and has an amorphous structure.

An eleventh embodiment is the semiconductor device according to the second embodiment, wherein a thickness of the second barrier layer ranges from 0.5 nm to 5 nm.

A twelfth embodiment is the semiconductor device according to the second embodiment, wherein the second barrier layer further comprises carbon and nitrogen.

A thirteenth embodiment is a planar transistor comprising a semiconductor device of the second embodiment and including a source contact and a drain contact, wherein the source contact and the drain contact each comprise the conductive wiring and the first barrier layer of the semiconductor device.

A fourteenth embodiment is a FinFET transistor comprising a semiconductor device of the third embodiment and including a source contact and a drain contact, wherein the source contact and the drain contact each comprise the conductive wiring and the first barrier layer of the semiconductor device.

A fifteenth embodiment is a 3-D V-NAND memory device comprising a semiconductor device of the second embodiment and including
a selection gate,
a word line staircase contact, and
a source line contact,
wherein the selection gate, word line staircase contact, and source line contact each comprise the conductive wiring and the first barrier layer of the semiconductor device.

A sixteenth embodiment is a method of forming a semiconductor metallization interconnect for a semiconductor device of the second embodiment, comprising:
forming at least one cobalt alloy with a cobalt content ranging from 30% to 99%; and
depositing the at least one cobalt alloy onto source and drain regions after Local-Inter-Connect etch or Local-Inter-Connect clean to act as a low resistance metal contact to the source and drain regions of a Metal-Oxide-Semiconductor Field Effect Transistor (MOSFET),
wherein the source and drain regions comprise at least one of Si, Ge, SiGe, SiC, and a III-V based semiconductor,
wherein atomic interaction of Ti in Co—Ti alloy with the source and drain regions forms a diffusion barrier to block metals from subsequent penetrating into the source and drain regions, and
wherein a height of a fundamental Metal-Semiconductor junction Schottky barrier is reduced to decrease the fundamental Metal-Semiconductor junction Schottky barrier to a current flow from a channel of the MOSFET to the contact or the Local-Inter-Connect.

A seventeenth embodiment is the method according to the sixteenth embodiment, wherein the at least one cobalt alloy comprises at least one of hafnium (Hf), tantalum (Ta) and titanium (Ti).

An eighteenth embodiment is a semiconductor device which is a three-dimensional Vertical-NOT-AND (3-D V-NAND) or Dynamic Random Access Memory (DRAM) and comprises at least one of Front-End-of-Line (FEOL), Middle-of-Line (MOL) and Back-End-of-Line (BEOL) semiconductor metallization interconnects made by the method of the sixteenth embodiment.

A nineteenth embodiment is a method of controlling a work-function of a semiconductor metallization interconnect for a semiconductor device of the second embodiment, comprising:

depositing at least one cobalt alloy onto a gate dielectric layer of an NMOS transistor, wherein the at least one cobalt alloy acts as a work-function gate electrode for the NMOS transistor;

depositing at least one cobalt alloy onto a gate dielectric layer of a PMOS transistor, wherein the at least one cobalt alloy acts as a work-function gate electrode for the PMOS transistor; and depositing at least one cobalt alloy as a liner onto each of the work-function gate electrodes to surround a core space and fill the core space with cobalt, forming the semiconductor metallization interconnect including the core filled with cobalt and the liner, wherein the work-function of the semiconductor metallization interconnect is controlled to be a value in a range from 4.2 eV to 5.2 eV.

A twentieth embodiment is the method of the nineteenth embodiment, wherein the cobalt alloy comprises at least one of hafnium (Hf), tantalum (Ta) and titanium (Ti).

Some example embodiments of the inventive concept address the above mentioned drawbacks of conventional art by providing a design of cobalt based metal alloys liners for interconnections which accommodates different types of semiconductor devices. In some example embodiments, cobalt fill follows the formation of the metal liners. In some example embodiments, copper fill follows the formation of the metal liners.

In some example embodiments, a new device is created with improved electrical properties such as speed, access time and lower power for microelectronics application in Dynamic Random Access Memory (DRAM), three-dimensional Vertical Not-AND (3-D V-NAND) Memory, and Metal-Oxide-Semiconductor Field-Effect Transistors (MOSFETs).

In some example embodiments, a semiconductor device comprising a substrate and a conductive wiring is disclosed. The conductive wiring comprises cobalt and is electrically connected to the substrate. An insulating layer electrically isolates the conductive wiring from neighboring wirings, and a first barrier layer which comprises a first cobalt alloy is disposed between the conductive wiring and the insulating layer.

In some example embodiments, the semiconductor device further comprises a second barrier layer comprising a second cobalt alloy. The second barrier layer is disposed between the conductive wiring and the substrate.

In some example embodiments, the cobalt alloy comprises cobalt and at least one of a group consisting of hafnium (Hf), tantalum (Ta) and titanium (Ti). In some example embodiments, at least one of the first barrier layer and the second barrier layer comprises an amorphous structure. In some example embodiments, at least one of the first barrier layer and the second barrier layer further comprises at least one of silicon (Si), carbon (C), nitrogen (N) and oxygen (O). In some example embodiments, the first barrier layer comprises at least one of a group consisting of hafnium (Hf), tantalum (Ta) and titanium (Ti) and at least one of a group consisting of silicon (Si), carbon (C), nitrogen (N) and oxygen (O). In some example embodiments, the second barrier layer comprises cobalt and at least one of a group consisting of silicon, SiGe, SiC and InGaAs.

In some example embodiments, the first barrier layer is formed of cobalt silicide having a crystalline structure and an epitaxial crystallographic relationship to the substrate. In some example embodiments, a thickness of the first barrier layer ranges from 1 nm to 30 nm. In some example embodiments, the second barrier layer comprises at least one of hafnium oxide, tantalum oxide and titanium oxide and has an amorphous structure. In some example embodiments, a thickness of the second barrier layer ranges from 0.5 nm to 5 nm. In some example embodiments, the second barrier layer further comprises carbon and nitrogen.

In some example embodiments, the semiconductor device is a planar transistor including a source contact and a drain contact. In some example embodiments, the semiconductor device is a FinFET transistor including a source contact and a drain contact. In some example embodiments, the semiconductor device is a 3-D V-NAND memory device includes a selection gate, a word line staircase contact, and a source line contact.

In some example embodiments, a method of forming a semiconductor device is disclosed. The method comprises processing steps of forming at least one cobalt alloy with cobalt composition ranging from 30% to 99%, and depositing the at least one cobalt alloy onto source and drain regions after Local-Inter-Connect etch or Local-Inter-Connect clean to act as a low resistance metal contact to the source and drain regions of a MOSFET. In some example embodiments, the source and drain regions comprise at least one of Si, Ge, SiGe, SiC, and a III-V based semiconductor.

In some example embodiments, the at least one cobalt alloy comprises Co—Ti alloy. Atomic interaction of Ti in Co—Ti alloy with the source and drain regions forms a diffusion barrier to block metals from subsequent penetrating into the source and drain regions. In some example embodiments, a height of a fundamental Metal-Semiconductor junction Schottky barrier is reduced to decrease the fundamental Metal-Semiconductor junction Schottky barrier to a current flow from a channel of the MOSFET to the contact or the Local-Inter-Connect.

In some example embodiments, the at least one cobalt alloy comprises at least one of hafnium (Hf), tantalum (Ta) and titanium (Ti). In some example embodiments, the method is used to make at least one of Front-End-of-Line (FEOL), Middle-of-Line (MOL) and Back-End-of-Line (BEOL) semiconductor metallization interconnects of a FinFET, a 3-D V-NAND or a DRAM.

In some example embodiments, a method of controlling a work-function of a semiconductor metallization interconnect is disclosed. The method comprises a processing step of depositing at least one cobalt alloy onto a gate dielectric layer of an NMOS transistor. The at least one cobalt alloy acts as a work-function gate electrode for the NMOS transistor. The method further comprises a step of depositing at least one cobalt alloy onto a gate dielectric layer of a PMOS transistor. The at least one cobalt alloy acts as a work-function gate electrode for the PMOS transistor. The method further comprises a step of depositing at least one cobalt alloy as a liner onto each of the work-function gate electrodes to surround a core space and fill the core space with cobalt, forming the semiconductor metallization interconnect including the core filled with cobalt and the liner. The work-function of the semiconductor metallization interconnect is controlled to be a value in a range from 4.2 eV to 5.2 eV. In an example embodiment, the cobalt alloy comprises at least one of hafnium (Hf), tantalum (Ta) and titanium (Ti). In an example embodiment, the method is used to make a FinFET, a 3-D V-NAND or a DRAM metallization interconnect.

The objects, features, and advantages of the present invention will be apparent from the following detailed descriptions of the various aspects of the invention in conjunction with reference to the drawings. The subject matter below is taught by way of various specific example embodiments explained in detail, and illustrated in the drawings.

BRIEF DESCRIPTION OF THE DRAWINGS

FIG. 8 shows a table of typical resistances of materials used in semiconductor industry.

DETAILED DESCRIPTION

Figure 1:
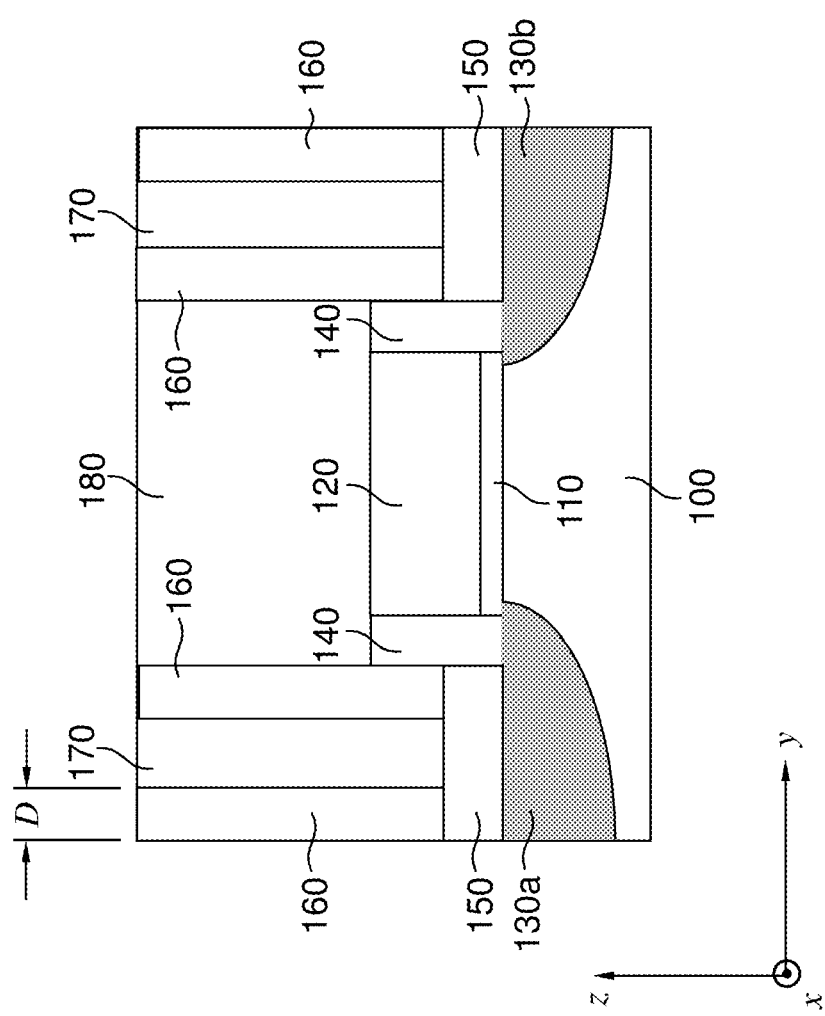
FIG. 1 illustrates a cross-sectional view of a MOSFET in related art along a source-drain direction, i.e., y-direction.

The present invention relates to a new family of devices that utilizes a new family of metal alloys in semiconductor industry wafer processing. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

A device with improved drive current, access time and reduced power consumption can be achieved by reducing the contact and line resistances that are designed to access it. For example, Static Random Access Memory (SRAM) is a volatile (data are erased when the applied power is switched off) universal data storage cell defining a "0" and a "1" in logic technology. A typical SRAM is composed of six transistors, wired together with Local-Inter-Connect (LIC) metallization. Access to individual transistors is through via contact to the gate, contact to source, contact to drain and contact to substrate. The resistances of access contacts to transistors and Local-Inter-Connect wiring forming the SRAM circuit determine directly the final performance of the circuit. Generally in FEOL this resistance is defined by access contact to transistor and in MOL by Local-Inter-Connect wiring. The current metallization art in FEOL/MOL includes high resistance Titanium, Titanium Nitride followed by lower resistance Tungsten deposition (Ti/TiN/W). In some instances minimum pitch BEOL metal lines' resistances contribute significantly to transistor access. The current metallization art in BEOL minimum pitch metal lines, includes high resistance Tantalum Nitride (TaN), Tantalum (Ta) and lower resistance Copper fill (TaN/Ta/Cu).

In FEOL and MOL sub-14 nm logic technology node, contacted gate pitch is as small as 60 nm with a contact Critical Dimension (CD) of less than 15 nm. Thus the small contact hole/trench volume leads to high resistance Ti and TiN to be the determining final resistivity of contact (it occupies more of the contact hole/trench volume) and not the W fill (it occupies less of the contact hole/trench volume) portion. Similarly in the BEOL the Vias and first few metal layers have pitches as small as 50 nm and CD of less than 15 nm. Thus the small Via/Trench metal hole volume leads to high resistance TaN and Ta to be the determining final resistivity of metals (it occupies more of the Via/metal hole/trench volume) and not the Cu fill (it occupies less of the Via/Trench metal hole volume).

A number of key factors that can be optimized to reduce these resistances include (but are not limited to) the following:

Interface resistance—In general a metal interface with that of a semiconductor forms a barrier to current flow called a Schottky barrier. The height of this barrier is dependent on properties of metal and semiconductor.

Metal liner resistance—The commonly used metals in microelectronics applications (tungsten and copper), require a liner metal for adhesion and diffusion properties. In the case of Tungsten the liner metals are high resistance Ti/TiN and in the case of copper high resistance TaN/Ta. In sub-14 nm node logic technology these metals determine the net resistance of the contacts/vias/lines as they occupy most of the volume of the holes/trenches.

Bulk metal fill resistance—Post liner metals (in general they have high resistance) the empty space is filled with lower resistance metals. In FEOL and MOL, this dominant metal is tungsten and in BEOL it is copper. However in aggressively pitched technology (sub-14 nm node logic node for example), the majority of the volume of the hole/trenches are occupied by high resistance liner metals.

FIG. 1 illustrates a cross-sectional view of a MOSFET in related art along a source-drain direction, i.e., y-direction. For demonstration purpose, a planar transistor is shown. The planar transistor of FIG. 1 includes a substrate 100, a gate dielectric layer 110, a gate electrode or gate metal 120, source and drain regions 130a and 130b, sidewall spacers 140, second barrier layers 150, first barrier layers 160, and contacts 170. The second barrier layer 150 contacts the source or drain region 130a or 130b. The first barrier layer 160 separates the contact 170 from the gate electrode 120. The contacts 170 are electrically isolated from each other by an insulating material layer 180. The first barrier layer 160 is disposed between the conductive wiring 170 and the insulating material layer 180. The metallization process includes forming Ti/TiN high resistivity metal liner in a through hole on a source region or a drain region of the planar transistor. This resistivity could be as high as 100 μΩ-cm. The liner formation is followed by a process to fill the space surrounded by the liner with tungsten which contacts the source region, or the drain region of the planar transistor.

In some related arts, the gate electrode is also formed of tungsten. Although the tungsten resistivity is of the order of 8 μΩ-cm, most of the volume of through hole is filled by the high resistance Ti/TiN metals having a liner thickness D, and tungsten of the contact 170 does not occupy a major volume of the through hole. This is due to the critical dimension (CD) of contact region on the source or drain region being as low as 10 nm in the sub-22 nm logic technology node. The liner 160 is also called first barrier layer functioning to prevent diffusion of metal from the contact 170 into the insulating material layer 180 to form pathways for leakage current or simply short the device causing malfunctioning.

This metallization scheme as a whole delivers a high resistance interconnect, impeding ideal device performance. The unacceptably high net resistance of the planar device in FIG. 1 is due to high resistance of the liner metals dominating the major volume of the through hole, and this is shown in the Equation (1) below.

$$R(\text{Current Art}) = R(\text{Interface}) + R(\text{Barrier}(Ti+TiN)) + \left(\frac{1}{R(\text{Barrier}(Ti+TiN))} + \frac{1}{R(W\ \text{Fill})}\right) \quad \text{Equation (1)}$$

where:

R (Current Art)=Approximate total resistance of contact hole or trench to a MOSFET source and drain.

R (Interface)=Resistance arising from the first metal contact (in this case Ti) with that of the heavily doped pockets of MOSFET's Source and Drain. This resistance is commonly referred to as Schottky Barrier.

R (Barrier (Ti+TiN))=Resistance of Ti+TiN at the bottom and sidewall liners of contact holes/trenches.

R (W Fill)=Resistance of Tungsten filling the contact hole/trench.

In related art, since R (Barrier (Ti+TiN)) is much greater than R (W Fill), the barrier resistance therefore dominates the entire resistance.

Figure 2:
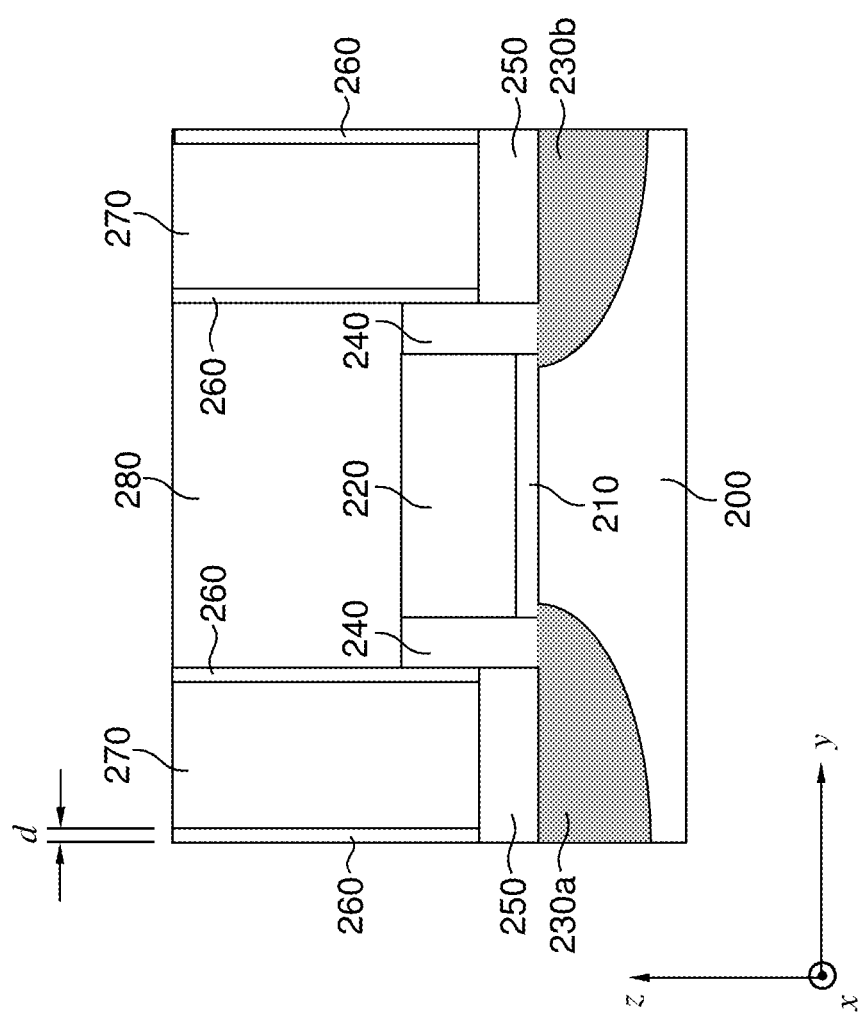
FIG. 2 illustrates a cross-sectional view of a MOSFET according to some example embodiments along a source-drain direction, i.e., y-direction.

FIG. 2 shows a cross-sectional view of a MOSFET according to some example embodiments along a source-drain direction, i.e., y-direction. For demonstration purpose, a planar transistor is shown. The planar transistor of FIG. 2 includes a substrate 200, a gate dielectric layer 210, a gate electrode or gate metal 220, source and drain regions 230a and 230b, sidewall spacers 240, second barrier layers 250, first barrier layers 260, and contacts or conductive wirings 270. The second barrier layer 250 is disposed between the substrate 200 and the contact 270. The second barrier layer 250 contacts the source or drain region 230a or 230b, in some embodiments. The first barrier layer 260 separates the contact 270 from the gate electrode 220. The contacts 270 are electrically isolated from each other by an insulating material layer 280.

The substrate 200 may include a single crystalline semiconductor material such as, but not limited to, Si, Ge, SiGe, GaAs, InSb, GaP, GaSb, InAlAs, InGaAs, GaSbP, GaAsSb, and InP. In some example embodiments, the substrate 200 is made of crystalline silicon.

The gate dielectric layer 210 is formed on the substrate 200 and comprises a high-k dielectric material including $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some example embodiments, the gate dielectric layer 210 includes an interfacial layer (not shown) formed between the channel layer of the substrate 200 and the dielectric material of the gate dielectric layer 210.

The gate electrode 220 comprises one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combination thereof. The gate electrode 220 is used as a mask during formation of the source/drain region 230a or 230b by doping using method of ion implantation or in-situ deposition.

The sidewall spacer 240 comprises one or more of $Si_3N_4$, SiON, SiCN, SiCO, SiOCN, or any other suitable dielectric material. The thickness of the sidewall spacer 240 is in a range from about 5 nm to about 20 nm.

The second barrier layer 250 is formed on the source or drain region 230a or 230b. The second barrier layer 250 comprises a cobalt alloy and is disposed between the conductive wiring 270 and the substrate 200. In some example embodiments, the second barrier layer 250 is optional.

The first barrier layer or liner 260 comprises at least one of a group consisting of hafnium (Hf), tantalum (Ta) and titanium (Ti) and at least one of a group consisting of silicon (Si), carbon (C), nitrogen (N) and oxygen (O). In some example embodiments, the first barrier layer 260 includes a cobalt alloy. The first barrier layer 260 has an amorphous structure, in some example embodiments. A through hole (not shown) is formed on the source or drain region 230a or 230b. A first barrier layer 260 is formed on the inner surface of the through hole to surround a space. The first barrier layer 260 is disposed between the contact 270 and the insulating material layer 280.

In some embodiments, the first barrier layer 260 is formed of an ultra-thin (thickness of less than 2 nm) cobalt alloy layer as a low-resistance liner and the resistivity could be as low as 10 μΩ-cm. The formation of the first barrier layer 260 is followed by filling the space surrounded by the first barrier layer 260 with bulk cobalt for a contact to source or drain region 230a or 230b. In an example embodiment, the gate electrode 220 itself is also cobalt-based. The cobalt in contact 270 has a resistivity of the order of 8 μΩ-cm and occupies a major volume of the through hole, comparing with the tungsten in the contact 170 in the related art in FIG. 1. This metallization scheme as a whole delivers a lower resistance interconnect and significantly improves the device performance.

In some example embodiments, the cobalt alloy liner or first barrier layer 260 and/or the cobalt metal in the contact 270 is deposited by Physical Vapor Deposition (PVD), Chemical Vapor Deposition (CVD), Metal-Organic Chemical Vapor Deposition (MOCVD), Atomic Layer Deposition (ALD) or combination and variations of these techniques. However, the selection of the methods for forming the cobalt liner and/or the cobalt metal is not limited to the above mentioned deposition methods. It is within the inventive concept to use any other types of thin film deposition methods for the cobalt alloy liner and the cobalt metal filling.

The benefits of the embodiment of FIG. 2 is clear from the first principal calculations derived below: the net resistance of the metals in the embodiment of FIG. 2, is significantly lower than that of the embodiment in FIG. 1 (as the equation implies below) due to elimination of high-resistance liner or barrier metals that dominate the volume of the through hole. Equation 2 shows:

$$R(\text{Proposed Art}) = R(\text{Interface}) + R(\text{Barrier}(Co \text{ Alloy})) + \left(\frac{1}{R(\text{Barrier}(Co \text{ Alloy}))} + \frac{1}{R(Co \text{ Fill})}\right) = R(\text{Interface}) + R(Co \text{ Fill})$$

Equation (2)

where:
R (Proposed Art)=Approximate total resistance of contact hole or trench to a MOSFET's source and drain.
R (Interface)=Resistance arising from the first metal contact (in this case Co—Ti) with that of the heavily doped pockets of MOSFET's source and drain regions. This resistance is commonly referred to as Schottky barrier. The embodiment of FIG. 2 significantly reduces this Schottky barrier for current flow. This interface resistivity is given by Equation (3):

$$\text{Interface Resistivity} \propto \text{Exp}\left(\frac{(\text{Carrier Charge})*(\text{Schottky Barrier Height})}{\sqrt{\text{Dopant Concentration in the source and drain}}}\right)$$

Equation (3)

R (Barrier (Co Alloy))=Resistance of Co Alloy at the bottom and sidewall liners of contact holes/trenches.
R (Co Fill)=Resistance of cobalt filling the contact hole/trench.
This net resistance improvement directly translates into RC delay improvement of the circuit in both logic and memory products.

Based on the above derivation, in a semiconductor device, a conductive wiring 270 comprised of cobalt (Co) is electrically isolated from neighboring wirings by an insulating material layer 280 and is electrically connected to the semiconductor substrate 200 comprised of silicon (Si), SiGe, SiC or InGaAs for example. At the first interface between the conductive wiring 270 and the insulator material layer 280 and at the second interface between the conductive wiring 270 and the semiconductor substrate 200, there exists barrier layers (i.e. the first barrier layer 260 and the second barrier layer 250) comprised of Co alloy including at least one element of Hf, Ta, and Ti. The second and first barrier layers 250 and 260 have amorphous structures and are further compromised of at least one element from silicon (Si), carbon (C), nitrogen (N), and oxygen (O). In some example embodiments, the first and second barrier layers 260 and 250 have the same structure and composition. In some example embodiments, the first and second barrier layers 260 and 250 do not have the same compositions.

The second barrier layer 250 at the second interface between the wiring 270 and the substrate 200 is composed of two layers (not shown), in some example embodiments. The first layer in contact with the substrate is comprised of Co and semiconductor (such as SiGe, SiC or InGaAs) and the second layer in contact with the conductive wiring 270 is comprised of at least one element from the first group of Hf, Ta, and Ti and at least one element from C, N, and O. The first layer is cobalt silicide which has a crystalline structure and has an epitaxial crystallographic relationship to the semiconductor substrate 200, and its thickness is in a range from 1 nm to 30 nm. The second layer is comprised of hafnium oxide, tantalum oxide or titanium oxide and has an amorphous structure with thickness ranging from 0.5 nm to 5 nm. The second layer further contains C and N.

The conductive wiring 270 of Co and the first barrier layer 260 that surrounds the conductive wiring 270 at its interface with the insulating material layer 280 can be implemented in a MOSFET's source/drain, electrode, and Local-Inter-Connect or minimum pitch metal lines to reduce RC delay of a circuit. In both DRAM and 3-D V-NAND this stack of barrier and metal will reduce access time to the device and thus improve read and write properties of it.

Figure 3:
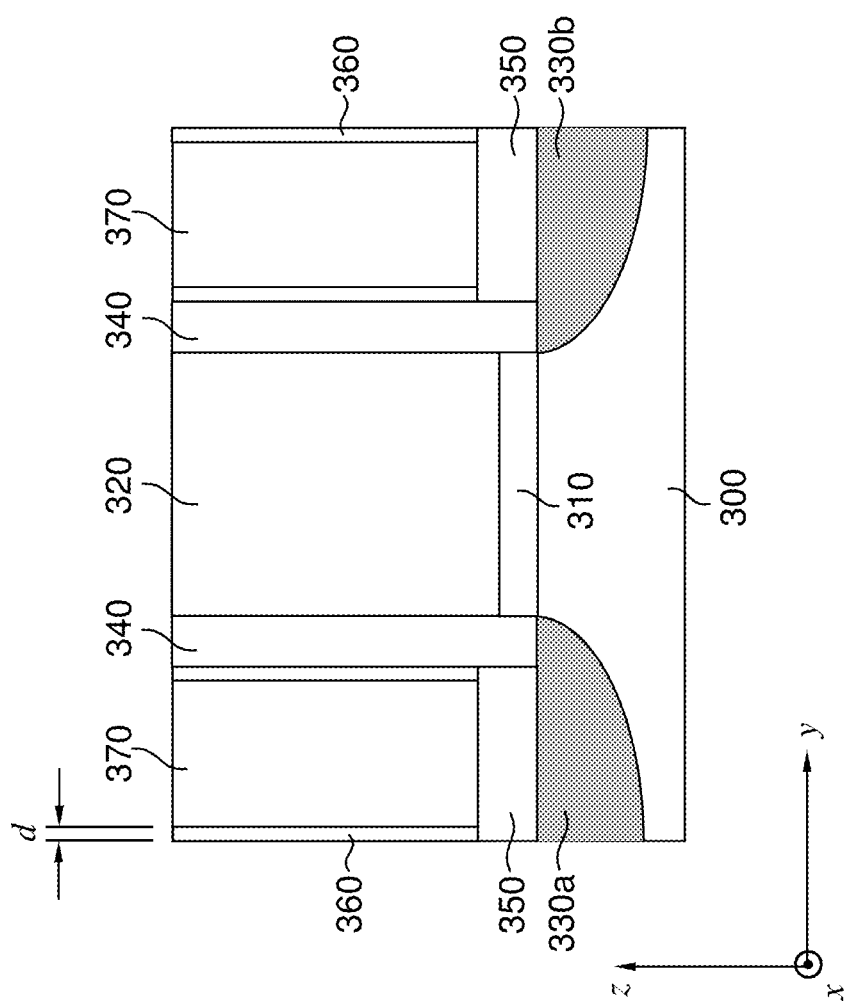
FIG. 3 illustrates a cross-sectional view of a MOSFET with FinFET structure according to some example embodiments along a source-drain direction, i.e., y-direction.

FIG. 3 illustrates a cross-sectional view of a MOSFET with FinFET structure according to some example embodiments along a source-drain direction, i.e., y-direction. The FinFET of FIG. 3 includes a substrate or fin 300, a gate dielectric layer 310, a gate electrode or gate metal 320, source and drain regions 330a and 330b, sidewall spacers 340, second barrier layers 350, first barrier layers 360, and contacts or conductive wirings 370. The second barrier layer 350 is disposed between the substrate or fin 300 and the contact 370. The second barrier layer 350 contacts the source or drain region 330a or 330b, in some embodiments. The first barrier layer 360 separates the contact 370 from the gate electrode 320.

The substrate or fin 300 may include a single crystalline semiconductor material such as, but not limited to, Si, Ge, SiGe, GaAs, InSb, GaP, GaSb, InAlAs, InGaAs, GaSbP, GaAsSb, and InP. In some example embodiments, the substrate or fin 300 is made of crystalline silicon.

The gate dielectric layer 310 is formed on the substrate or fin 300 and includes a high-k dielectric material including $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some example embodiments, the gate dielectric layer 310 includes an interfacial layer (not shown) formed between the channel layer of the substrate or fin 300 and the dielectric material of the gate dielectric layer 310.

The gate electrode 320 comprises one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combination thereof. The gate electrode 320 is used as a mask during formation of the source/drain region 330a or 330b by doping using method of ion implantation or in-situ deposition.

The sidewall spacer 340 comprises one or more of $Si_3N_4$, SiON, SiCN, SiCO, SiOCN, or any other suitable dielectric material. The thickness of the sidewall spacer 340 is in a range from about 5 nm to about 20 nm.

The second barrier layer 350 is formed on the source or drain region 330a or 330b. The second barrier layer 350 comprises a cobalt alloy and is disposed between the conductive wiring 370 and the substrate or fin 300. In some example embodiments, the second barrier layer 350 is optional.

The first barrier layer or liner 360 includes at least one of a group consisting of hafnium (Hf), tantalum (Ta) and titanium (Ti) and at least one of a group consisting of silicon (Si), carbon (C), nitrogen (N) and oxygen (O). In some example embodiments, the first barrier layer 360 includes a cobalt alloy. The first barrier layer 360 has an amorphous structure, in some example embodiments. A through hole (not shown) is formed on the source or drain region 330a or 330b. A first barrier layer 360 is formed on the inner surface of the through hole to surround a space.

In some embodiments, the first barrier layer 360 is formed of an ultra-thin (thickness of less than 2 nm) cobalt alloy layer as a low-resistance liner and the resistivity could be as low as 10 μΩ-cm. The formation of the first barrier layer 360 is followed by filling the space surrounded by the first barrier layer 360 with bulk cobalt for a contact to source or drain region 330a or 330b. In an example embodiment, the gate electrode 320 itself is also cobalt-based. The cobalt in contact 370 has a resistivity of the order of 8 μΩ-cm and occupies a major volume of the through hole, comparing with the tungsten in the contact 170 in the related art in FIG. 1. This metallization scheme as a whole delivers a lower resistance interconnect, improving the device performance significantly.

In some example embodiments, the cobalt alloy liner or first barrier layer 360 and/or the cobalt metal in the contact 370 is deposited by Physical Vapor Deposition (PVD), Chemical Vapor Deposition (CVD), Metal-Organic Chemical Vapor Deposition (MOCVD), Atomic Layer Deposition (ALD) or combination and variations of these techniques. However, the selection of the methods for forming the cobalt liner and/or the cobalt metal is not limited to the above mentioned deposition methods. It is within the inventive concept to use any other types of thin film deposition methods for the cobalt alloy liner and the cobalt metal filling.

The three-dimensional structure and the contact structure including first barrier layer 360 and contact 370 of FinFET in FIG. 3 provide better device performance compared to the planar transistor in FIG. 1. The related art manufactures a FinFET with higher performance by reducing the external resistance of the FinFET device but not the resistance in the FinFET or in the contact structure in the FinFET. The metallization process of the FinFET of FIG. 3 includes an ultra-thin (thickness of less than 2 nm) cobalt alloy as low resistance liner metal in liner or first barrier layer 360. The resistivity of the liner in the FinFET is as low as 10 μΩ-cm, in some example embodiments. The cobalt metal processing is followed by filling a space surrounded by the liner 360 with cobalt in bulk form for contacts of source or drain region 330a or 330b of the FinFET. In some example embodiments, the gate electrode 320 itself could also be cobalt-based. The cobalt resistivity is in the order of 8 μΩ-cm, in some example embodiments, and the cobalt fills the major volume of the through hole of the contact structure on the source or drain region 330a or 330b, even in a contact critical dimension (CD) being as low as 10 nm in sub-22 nm logic technology node. This metallization scheme as a whole delivers a lower resistance interconnect, thus improving device performance significantly.

In some example embodiments, the cobalt alloy liner and/or the cobalt metal of the FinFET is deposited by Physical Vapor Deposition (PVD), Chemical Vapor Deposition (CVD), Metal-Organic Chemical Vapor Deposition (MOCVD), Atomic Layer Deposition (ALD) or combination and variations of these techniques. However, the selection of the methods for forming the cobalt liner and/or the cobalt metal is not limited to the above mentioned deposition methods. It is within the inventive concept to use any other types of thin film deposition methods for the cobalt alloy liner and the cobalt metal filling.

Figure 4:
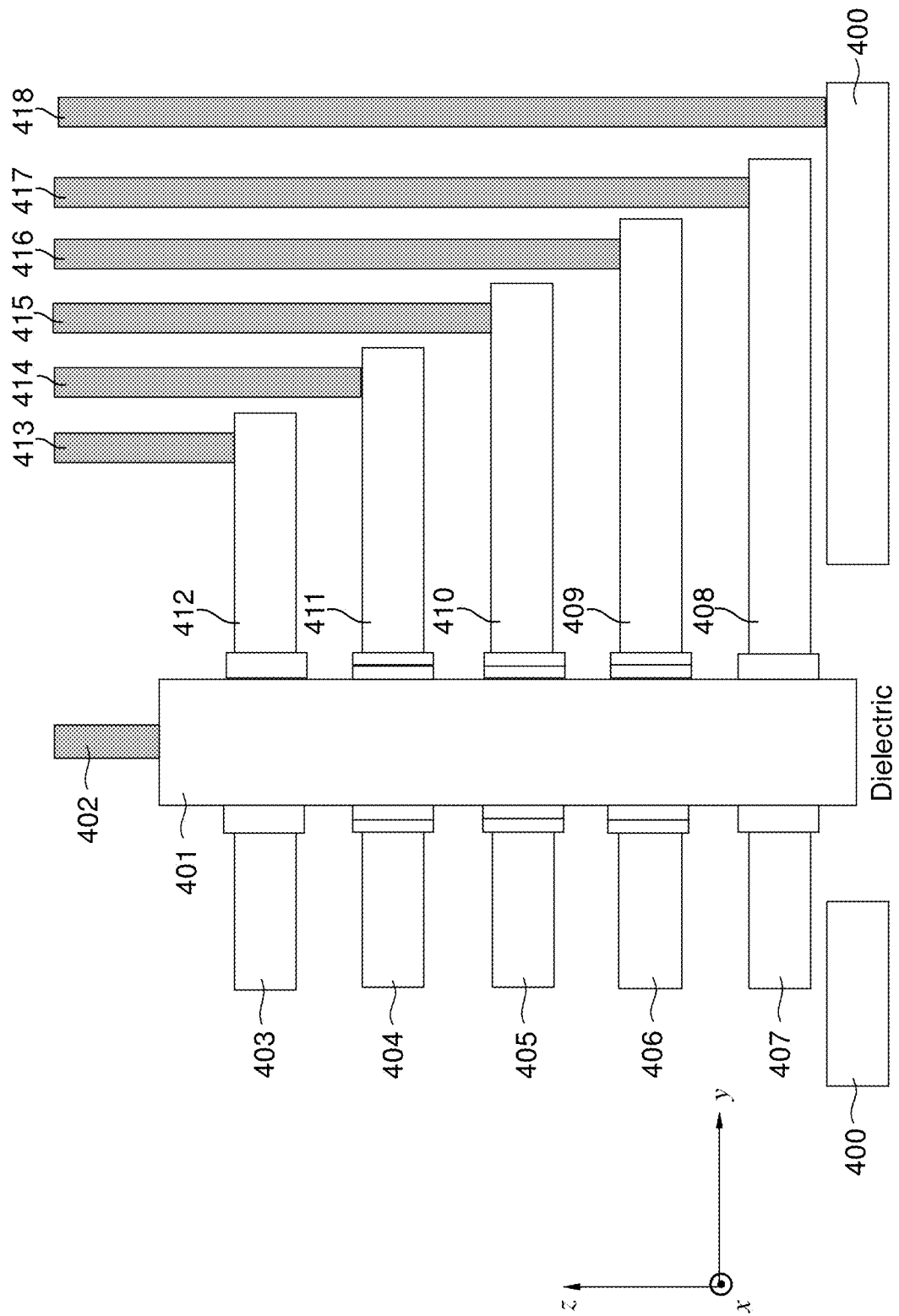
FIG. 4 illustrates a 3-D V-NAND memory cell in related art.

FIG. 4 illustrates a 3-D V-NAND memory cell in related art. For illustration purpose, only five layers are shown. That is, a layer including selection gate (SL) 403 and 412, a layer including control gates (Word lines) 404 and 411, a layer including control gates (Word lines) 405 and 410, a layer including control gates (Word lines) 406 and 409, and a layer including selection gates (SL) 407 and 408. These five layers are electrically connected (e.g., via a dielectrics stack) to the channel 401 which is positioned on a dielectric layer. On the channel 401 and the end region of the staircase structure of the five layers 412, 411, 410, 409, and 408, line contacts 402, 413, 414, 415, 416, 417, and 418 are formed, respectively. The line contact 402 is a bit line and the other lines are word lines and source lines. Staircase contact holes (not shown) with variable aspect ratios of greater than 30:1 to greater than 80:1 are processed in one step.

Similar to logic technology, the metallization process includes Ti/TiN as high resistance liner metals in the through holes, i.e. the liner of the contact lines 402, 413, 414, 415, 416, 417, and 418 are Ti/TiN layer. Then, the Ti/TiN processing is followed by a process of filling the space surrounded by the liner of Ti/TiN with bulk tungsten for contact to diffusion lines and Word lines. Due to extremely high aspect ratios of contact holes, this process suffers from high resistance and resistance variation across the length of the contact and contact to contact. This metallization scheme as a whole delivers a high resistance interconnect, impeding ideal device performance.

Figure 5:
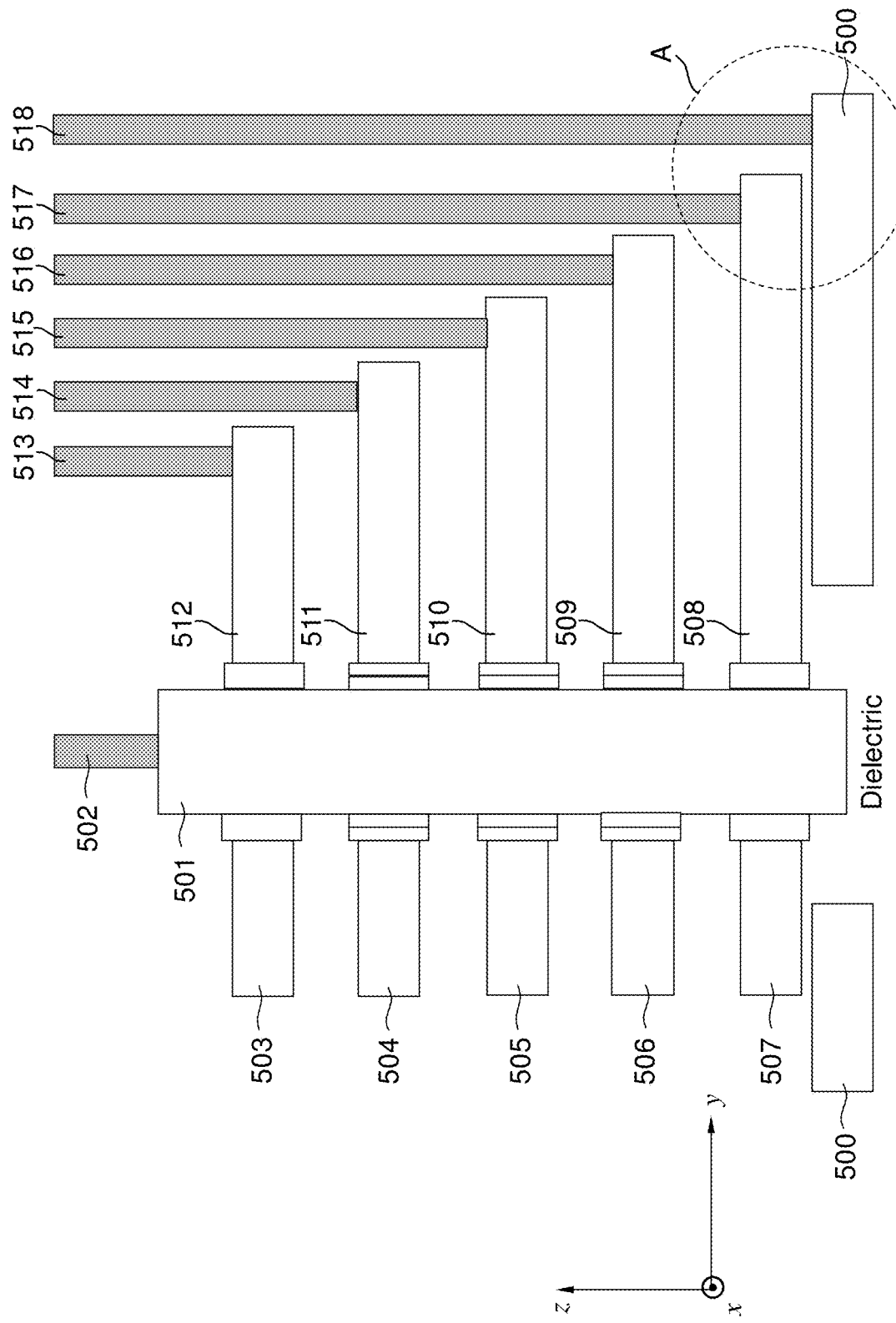
FIG. 5 illustrates a 3-D V-NAND memory cell according to some example embodiments.

FIG. 5 illustrates a 3-D V-NAND memory cell including a cobalt alloy liner and cobalt metal filling according to some example embodiments. For illustration purpose, only five layers are shown. That is, a layer including selection gate (SL) 503 and 512, a layer including control gates (Word lines) 504 and 511, a layer including control gates (Word lines) 505 and 510, a layer including control gates (Word lines) 506 and 509, and a layer including selection gates (SL) 507 and 508. These five layers are electrically connected (e.g., via a dielectrics stack) to the channel 501 which is positioned on a dielectric layer. On the channel 501 and the end region of the staircase structure of the five layers 512, 511, 510, 509, and 508, line contacts 502, 513, 514, 515, 516, 517, and 518 are formed, respectively. The line contact 502 is a Bit line and the other lines are Word lines and Source lines. Staircase contact holes (not shown) with variable aspect ratios of greater than 30:1 to greater than 80:1 are processed in one step.

In some example embodiment, the metallization process includes an ultra-thin (thickness of less than 2 nm) cobalt alloy as low resistance liner metal. The resistivity of the contact line could be as low as 10 $\mu\Omega$-cm. The cobalt metal processing is followed by a processing of filling the space surrounded by the liner with bulk cobalt for contact to diffusion lines and Word Lines. The cobalt resistivity is in the order of 8 $\mu\Omega$-cm, and the cobalt, instead of the liner material, now fills the major volume of through holes. This metallization scheme as a whole delivers a lower resistance interconnect, and therefore, significantly improves the device performance.

In some example embodiments, the cobalt alloy liner and/or the cobalt metal of the 3-D V-NAND is deposited by Physical Vapor Deposition (PVD), Chemical Vapor Deposition (CVD), Metal-Organic Chemical Vapor Deposition (MOCVD), Atomic Layer Deposition (ALD) or combination and variations of these techniques. However, the selection of the methods for forming the cobalt liner and/or the cobalt metal is not limited to the above mentioned deposition methods. It is within the inventive concept to use any other types of thin film deposition methods for the cobalt alloy liner and the cobalt metal filling.

Figure 6:
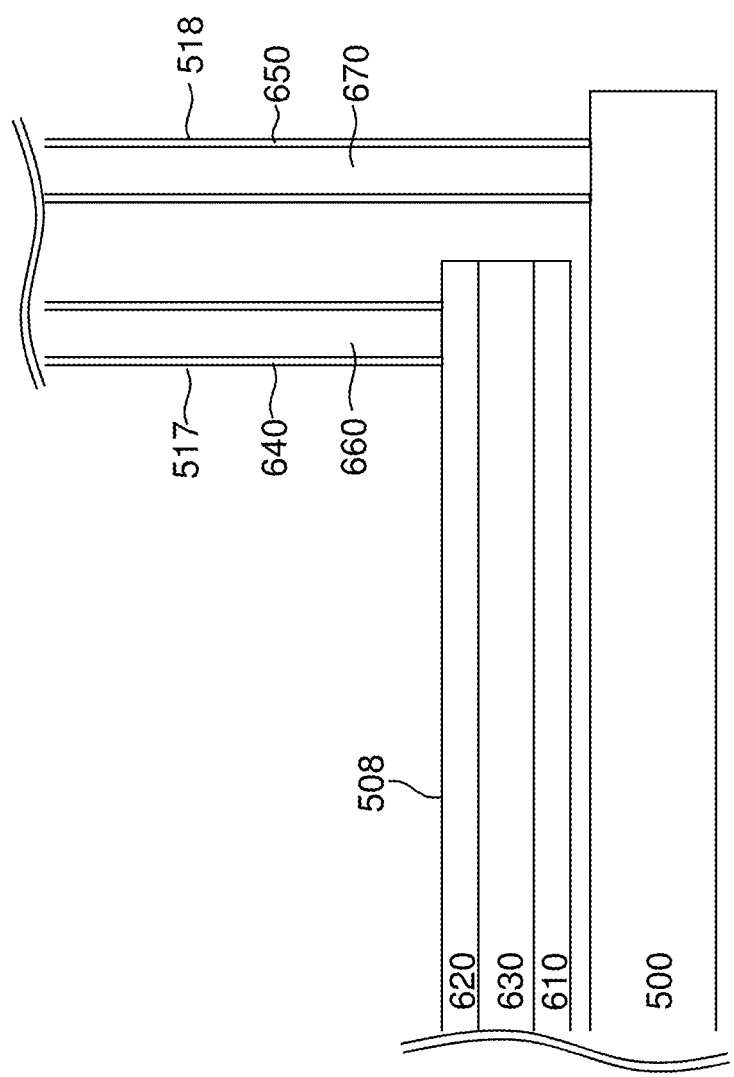
FIG. 6 illustrates an enlarged region labelled A in FIG. 5.

FIG. 6 illustrates an enlarged region labelled A in FIG. 5. In the enlarged region A, the selection gate (SL) 508 has cobalt alloy layers 610 and 620 and cobalt layer 630. Each of the lines 517 and 518 has cobalt alloy layer 640 and cobalt filling 660, or cobalt alloy layer 650 and cobalt filling 670. This structure narrows the liner material layer 640 and 650 and increases the volume occupied by low resistance contact metal cobalt which has a resistivity lower than a Ti/TiN/W stack.

Figure 7:
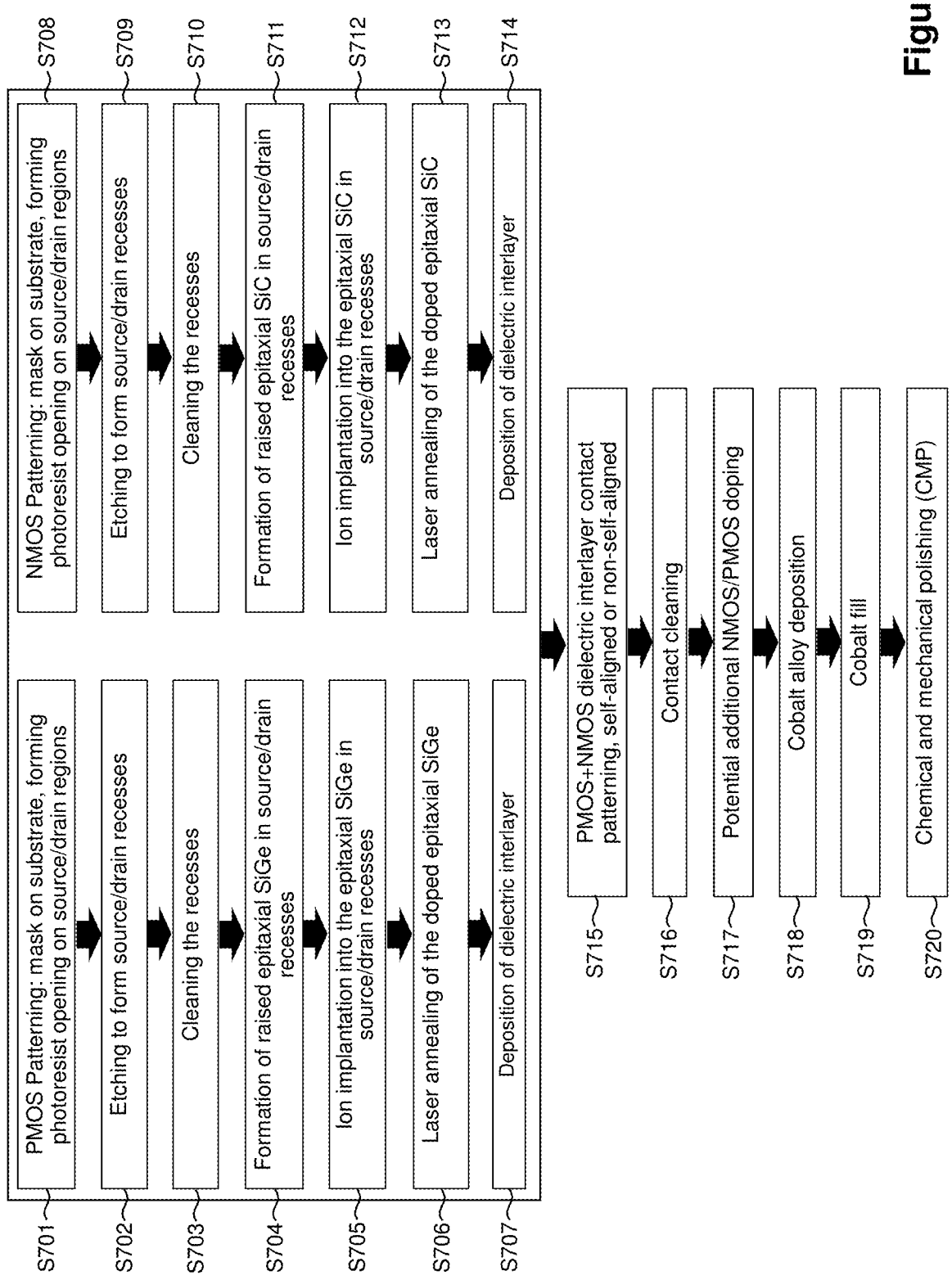
FIG. 7 shows a method of forming a MOSFET, according to some example embodiments.

FIG. 7 shows a flow diagram illustrating method of forming a MOSFET Local-Inter-Connect in an example embodiment. In the process flow, steps S701, S702, S703, S704, S705, S706, and S707 are processing steps for manufacturing a PMOS transistor, according to an embodiment of the present disclosure. Processing steps S708, S709, S710, S711, S712, S713, and S714 are processing steps for manufacturing an NMOS transistor. The two sets of steps may be processed simultaneously, in some example embodiments. In some example embodiments, they are processed independently. When the PMOS is being processed, the NMOS region is covered by a protection layer which includes a resist and hard mask material. When the processing steps in the PMOS region are finished, the protective layer covering the NMOS region is removed and the steps for manufacturing an NMOS transistor (i.e. S708, S709, S710, S711, S712, S713, and S714) are processed. After the PMOS and NMOS manufacturing steps, the steps to manufacture the overall device (i.e. steps S715, S716, S717, S718, S719, and S720) are processed.

First, the protective layer is formed to cover only the NMOS region and does not cover the PMOS region. A photolithographic and etching method is processed to carry out the steps of S701 and S702. In the step S701, a photoresist layer is formed on a substrate by spinning or deposition methods. A mask is positioned on the substrate. In some example embodiments, UV photolithography is carried out. The mask provides opening to allow the UV electromagnetic wave to pass through to the photoresist to chemically change the photoresist. A development process is then carried out to form a pattern of photoresist. Using the pattern of the photoresist, etching of the substrate is processed by wet etching or dry etching using HCl or other suitable etchant. In step S703, a cleaning process is carried out to clean the etched recessed in the source or drain region in the substrate. In step S704, raised epitaxial SiGe layer is formed in the etched recesses in the source or drain region, and SiGe is in-situ doped. In step S705, ion implantation is carried out to dope the formed raised epitaxial SiGe layer to increase the amount of charge carrier in the quantum wells. In step S708, the doped epitaxial SiGe layer is annealed by laser so as to activate the dopants and to fully transfer the strain/stress caused by this layer to the channel of the transistor. In step S707, a dielectric interlayer is deposited to electrically isolate the doped source/drain regions from each other. Then the protective layer covering the NMOS region is removed, and the PMOS region is covered by a protective layer.

A photolithographic and etching method is processed to carry out the steps of S708 and S709. In the step S708, a photoresist layer is formed on a substrate by spinning or deposition methods. A mask is positioned on the substrate. In some example embodiments, UV photolithography is carried out. The mask provides opening to allow the UV electromagnetic wave to pass through to the photoresist to chemically change the photoresist. A development process is then carried out to form a pattern of photoresist. Using the pattern of the photoresist, etching of the substrate is processed by wet etching or dry etching using HCl or other suitable etchant. In step S710, a cleaning process is carried out to clean the etched recessed in the source or drain region in the substrate. In step S711, raised epitaxial SiC layer is formed in the etched recesses in the source or drain region, and the SiC is in-situ doped. In step S712, ion implantation is carried out to dope the formed raised epitaxial SiC layer to increase the amount of charge carrier in the quantum wells. In step S713, the doped epitaxial SiC layer is annealed by laser so as to activate the dopants and to fully transfer the strain/stress caused by this layer to the channel of the transistor. In step S714, a dielectric interlayer is deposited to electrically isolate the doped source/drain regions from each other. Then, the protective layer covering the PMOS is removed.

In step S715, a process of self-aligned or non-self-aligned dielectric interlayer contact patterning is carried out. In step S716, a contact cleaning is carried out. In step S717, a potential additional NMOS/PMOS doping is carried out but this step is optional, in some embodiment. In some example embodiments, in step S718, at least one cobalt alloy with cobalt composition ranging from 30% to 99% is formed. The step S718 includes depositing the at least one cobalt alloy onto source and drain regions after Local-Inter-Connect etch or Local-Inter-Connect clean to act as a low resistance metal contact to the source and drain regions of the MOSFET. In some example embodiments, the source and drain regions comprise at least one of Si, Ge, SiGe, SiC, and a III-V based semiconductor. In some example embodiments, the atomic interaction of Ti in Co—Ti alloy with the source and drain regions forms a diffusion barrier to block metals from subsequent penetrating into the source and drain regions. In some example embodiments, a height of a fundamental metal-semiconductor junction Schottky barrier is reduced to decrease the fundamental Metal-Semiconductor junction Schottky barrier to a current flow from a channel of the MOSFET to the contact or the Local-Inter-Connect. In some example embodiments, the at least one cobalt alloy comprises at least one of hafnium (Hf), tantalum (Ta) and titanium (Ti). In step S719, the core space surrounded by the cobalt alloy liner is filled with cobalt by deposition method such as chemical vapor deposition CVD, physical vapor deposition such as sputtering or pulsed laser deposition. In step S720, chemical and mechanical polishing (CMP) is carried out to planarize the surface.

In some example embodiments, recessed/raised source/drain could be Si, SiGe or SiC based material. In some instance a thin layer of small band-gap semiconductor material such as InGaAs could be deposited prior to contact metallization. This further allows for lower resistance path post metallization. Post contact etch and clean, the metallization consists of an ultra-thin (thickness of less than 2 nm) cobalt alloy as low resistance liner metal followed by cobalt metal fill.

The steps S718 and S719 are also used to make FEOL, MOL and BEOL semiconductor metallization interconnects of a FinFET, a 3-D V-NAND or a DRAM, in some example embodiments.

In some example embodiments, the above method is used to control the work-function of a metal in a semiconductor metallization interconnect. That is, the method includes depositing at least one cobalt alloy onto a post gate dielectric to act as work-function gate electrode for NMOS transistor, depositing at least one cobalt alloy onto post gate dielectric to act as work-function gate electrode for PMOS transistor, and depositing at least one cobalt alloy onto post work-function gate electrode and fill the remaining voids in the gate electrode trenches with cobalt. The work-function of the metal is controlled to be a value in a range from 4.2 eV to 5.2 eV. The cobalt alloy comprises at least one of hafnium (Hf), tantalum (Ta) and titanium (Ti). This method is also used to make a FinFET, a 3-D V-NAND or a DRAM metallization interconnect, in some example embodiments.

In some example embodiments, comparing with conventional art utilizing W/Ti/TiN structure, the bilayer deposition of high-resistance Ti/TiN is replaced with a single layer deposition of a Co alloy layer, and the deposition of the W nucleation layer is eliminated. In an example embodiment, the Co alloy layer is an amorphous layer. In an example embodiment, the thickness of the Co alloy layer is about 1 nm. In an example embodiment, the Co alloy is Co—Ti binary alloy. The Co alloy layer retards silicide growth, and it also prevents the lateral growth of silicide beyond the contact area and also beyond the highly doped epitaxial area.

FIG. 8 shows a table of typical bulk resistance values of materials used in semiconductor industry. The structure of Ti/TiN/W on typical 10 nm contact critical dimension (CD) results a resistivity close to 100 μΩ-cm. This high resistivity deteriorates the device performance. This high resistivity is due to the fact that with narrow dimensions of the volume of contact through hole due to the limited CD, most of the volume of the through hole is filled with Ti/TiN liner (resistivity of 54 or 13-130 μΩ-cm from FIG. 8) but not W contact metal (resistivity of about 5.28 μΩ-cm from FIG. 8).

EXAMPLES

Example 1

On a $SiO_2$ substrate as an insulator material or on a Si substrate as a semiconductor substrate, an interface layer of Co alloy having a thickness of 0.5 nm to 5 nm was deposited by co-sputtering of pure metal targets of Co and an alloying element metal. This was followed by sputter deposition of a Co layer as a conductive wiring to a thickness of 150 nm. Some samples were subjected to thermal annealing in vacuum at elevated temperatures. Description of experimental results in the following is an example of Co-25 at. % Ti (25 atomic percent) alloy as an interface layer. It is noted that same tendency was obtained in other binary Co alloys having Ti, Ta, and Hf as alloying elements with their concentration range of 10 to 80 at. % for Ti, 3 to 25 at. % for Ta, and 2 to 25 at. % for Hf. Adhesion of the Co layer on $SiO_2$ and Si was investigated by tape test. The test was carried out by cutting the Co surface into 10×10 squares with the spacing of 1 mm using a razor cutter, putting a scotch tape on the Co layer, rubbing the tape surface briskly with fingers, and peeling off the tape from the Co layer, and counting the numbers of remaining squares of the Co layer. Diffusion barrier properties of the interface layer between Co and $SiO_2$ was investigated using a layer stack structure of Co/Co Alloy/$SiO_2$/p-type Si/Aluminum. The Aluminum (Al) electrode film on the back side of the Si substrate was deposited by sputtering and annealing in vacuum at 350° C. for 10 minutes to obtain good low resistivity (Ohmic) contact. Capacitance-voltage curves were obtained before and after Bias Thermal Annealing (BTA) at a field strength of 3 MV/cm at a temperature of 300° C. for various time durations. The magnitude of flat-band shift was used as a quantitative measure of the diffusion of positive metallic ions into $SiO_2$. Electrical contact properties of Co on Si was investigated by measuring contact resistivity using a Circular Transmission Line Method (CTLM). Samples were prepared by patterning the Co/Co Alloy layer into a circular pattern using a photolithography method. A Si substrate used was a p-type Si (001) oriented single crystal wafer with a surface phosphorous density of $10^{21}/cm^3$ within the depth of 30 nm from the Si surface. Cross section samples were prepared by a focused ion beam microscope. The microstructure of the as-deposited and annealed samples were observed by High-Resolution Transmission Electron Microscopy (HR-TEM). Chemical composition profile was measured by X-ray Energy Dispersive Spectroscopy (EDS).

Example 2

Various compositions of Co—Ti alloy films were deposited by co-sputtering on thermal $SiO_2$/Si substrates. The experimental composition range of an amorphous phase was found to be Co-(22 to 80) at. % Ti by transmission electron microscopy and electron diffraction. Electrical resistivity of the as-deposited films was measured by a four-point probe method. Co-25 at. % Ti was employed for other experiments. The structure and composition profile of the amorphous phase were investigated by TEM-EDS. Capacitance-voltage curves were obtained using MOS samples with patterned top electrodes on th-SiO$_2$/p-Si/Al using a photolithography method before/after thermal annealing (TA) at various temperatures for 10 min and bias thermal anneal (BTA) under 3 MV/cm. Flat-band voltage was deduced by plotting 1/C$^2$ versus V. For contact property study, Co (200 nm)/Co-25Ti (1, 2, 3 nm)/p$^+$-Si or n$^+$-Si samples were formed and annealed up to 400° C. for 1 min. It is noted that the thicknesses are all nominal values. The dopant concentration of p$^+$-Si and n$^+$-Si was 3 to 5×10$^{18}$ cm$^{-3}$ and 10$^{21}$ cm$^3$, respectively. Some samples were annealed for 30 min. A circular TLM method was employed to obtain contact resistivity. The microstructure and composition profile before/after annealing were also examined.

Example 3

Substrates were p-type Si wafers coated with a 40 nm thick thermally grown SiO$_2$ film. The films were deposited on the substrates by co-sputtering of Co and Ti targets following sputtering of 150 nm thick Cu film with a working pressure of 6×10$^{-1}$ Pa and a 99.99% purity level of Ar gas flow at 15 sccm. The base pressure of the sputter chamber was kept below 10$^{-5}$ Pa. The structure and morphology of the Cu (150 nm)/CoTi$_x$ (3 nm) stacks were characterized by HRTEM, equipped with an energy dispersive X-ray (EDX) spectrometer.

Example 4

Co film (150 nm) and CoTi$_x$ thin film (3 nm) were deposited on SiO$_2$/p-type Si wafers by co-sputtering of two pure metal targets with a working pressure of 6×10$^{-1}$ Pa and a 99.9999% purity level of Ar gas flow at 15 sccm. Film resistivity was measured by a four-point probe method.

Results from the various examples are discussed below.

Figure 9:
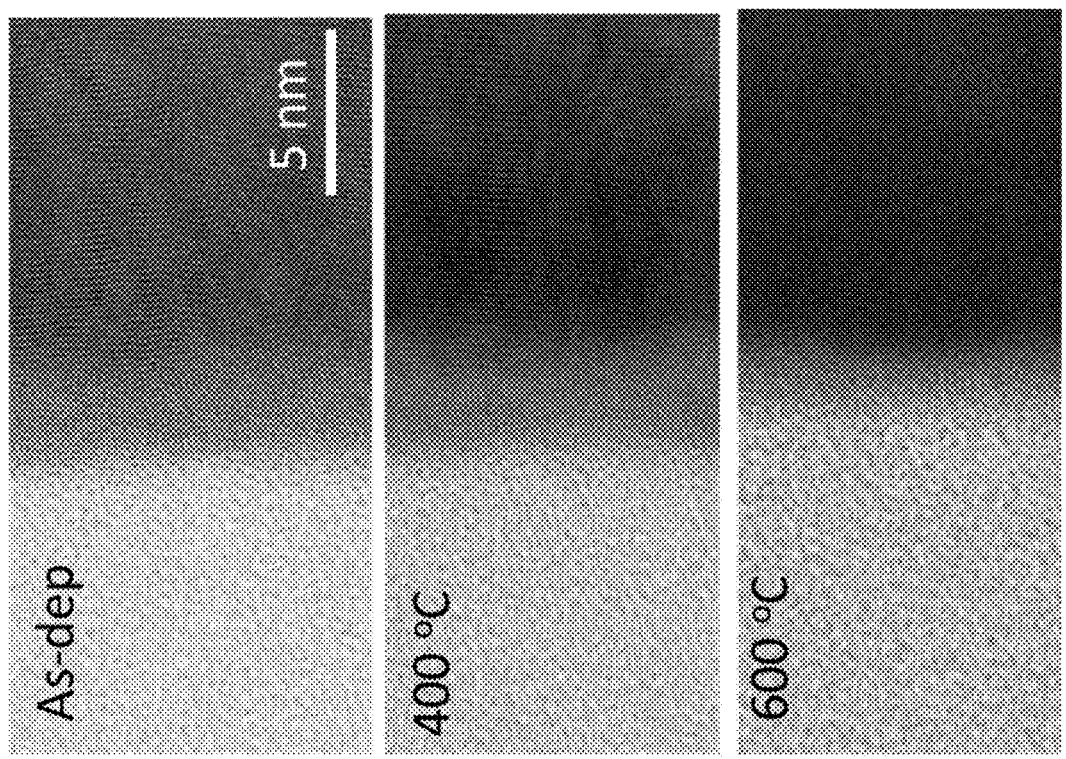
FIG. 9 shows Transmission Electron Microscopy (TEM) cross-sectional images of the as-deposited (top image), 400° C. annealed (middle image), and 600° C. (bottom image) of microstructure of $Co/CoTi/SiO_2$, according to some example embodiments.

FIG. 9 shows Transmission Electron Microscopy (TEM) cross-sectional images of the as-deposited or "As-dep" (top image), 400° C. annealed (middle image), and 600° C. (bottom image) of microstructure of Co/CoTi/SiO$_2$, according to example embodiments of the present disclosure. The top figure of FIG. 9 shows an as-deposited sample with approximately 150 nm thick Co layer. Prior to annealing, the top figure of FIG. 9 indicates that the approximately 3 nm thick CoTi$_x$ layer has an amorphous structure with a disorganized atomic arrangement. The middle and bottom figures of FIG. 9 show the annealed Co/CoTi/SiO$_2$ samples at 400° C. and 600° C. for 10 minutes, respectively. After annealing at 400° C. (middle figure of FIG. 9), the CoTi$_x$ layer stays amorphous with continuous layer structure. Composition profiles of the as-deposited and the 400° C. annealed samples (top and middle figures of FIG. 10) both show that Co and Ti are located in the interface layer. Further annealing at 600° C. results in thickness reduction of Co—Ti layer as well as formation of crystalline regions from amorphous regions (bottom figures of FIGS. 9 and 10).

Figure 10:
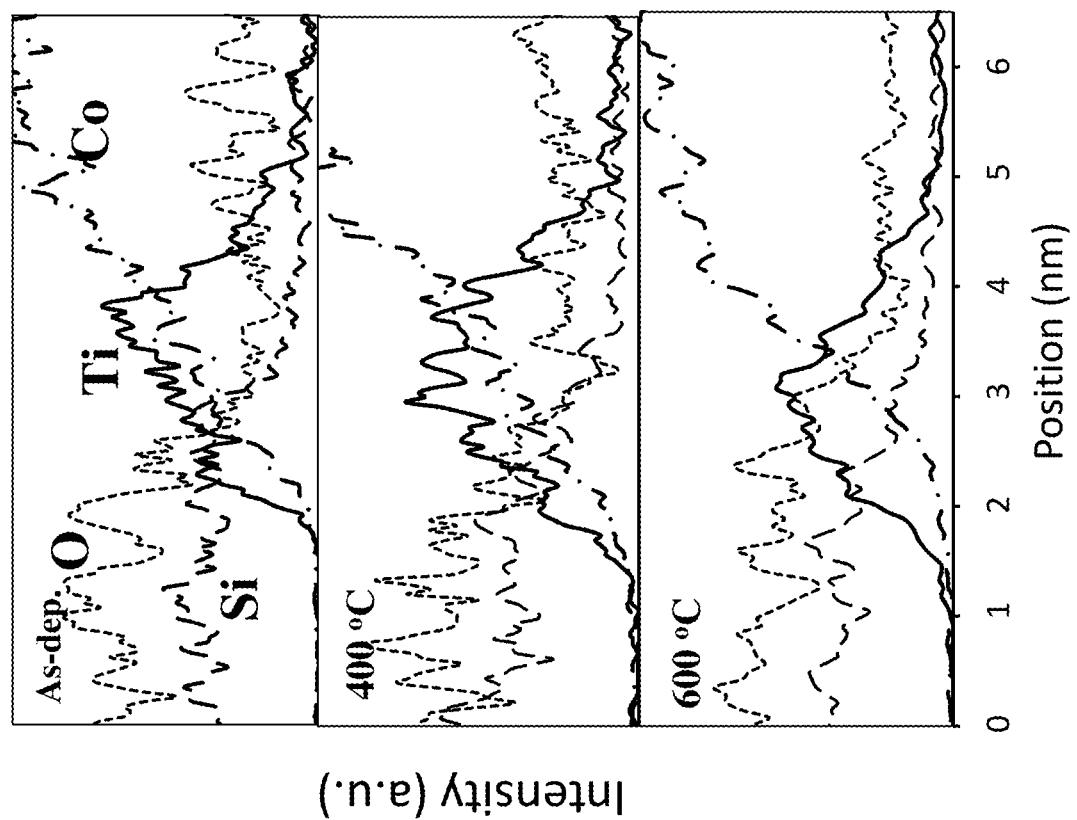
FIG. 10 shows Energy Dispersive Spectroscopy (EDS) intensity profiles of the as-deposited (top image), 400° C. annealed (middle image), and 600° C. annealed (bottom image) of cobalt alloy barrier layer of Co (150 nm)/Co—Ti (3 nm)/$SiO_2$ sample structure according to some example embodiments.

FIG. 10 shows Energy Dispersive Spectroscopy (EDS) intensity profiles of the as-deposited (top image), 400° C. annealed (middle image), and 600° C. annealed (bottom image) of cobalt alloy barrier layer of Co (150 nm)/Co—Ti (3 nm)/SiO$_2$ sample structure according to example embodiments of the present disclosure. The Ti distribution shifts toward SiO$_2$ side which is accompanied with the separation of O from SiO$_2$. The interface layer is comprised mainly of cobalt and titanium, together with a small amount of silicon and oxygen. For the Co profile, it is initially broad before annealing because of the overlapped distribution of Co in the CoTi$_x$ layer with the top Co film. With increasing annealing temperature, the Co intensity shows a steep increase from the interface towards the top Co film, indicating the separation of Co from the CoTi$_x$ layer and merging with the top Co film. Post 600° C. anneal the interface layer is no longer clearly identified. Based on EDS results cobalt is separated from the interface layer and is merged with the cobalt over-layer. These results indicate that the amorphous structure and the chemical composition of the cobalt alloy interface layer becomes unstable above 600° C.

Figure 11:
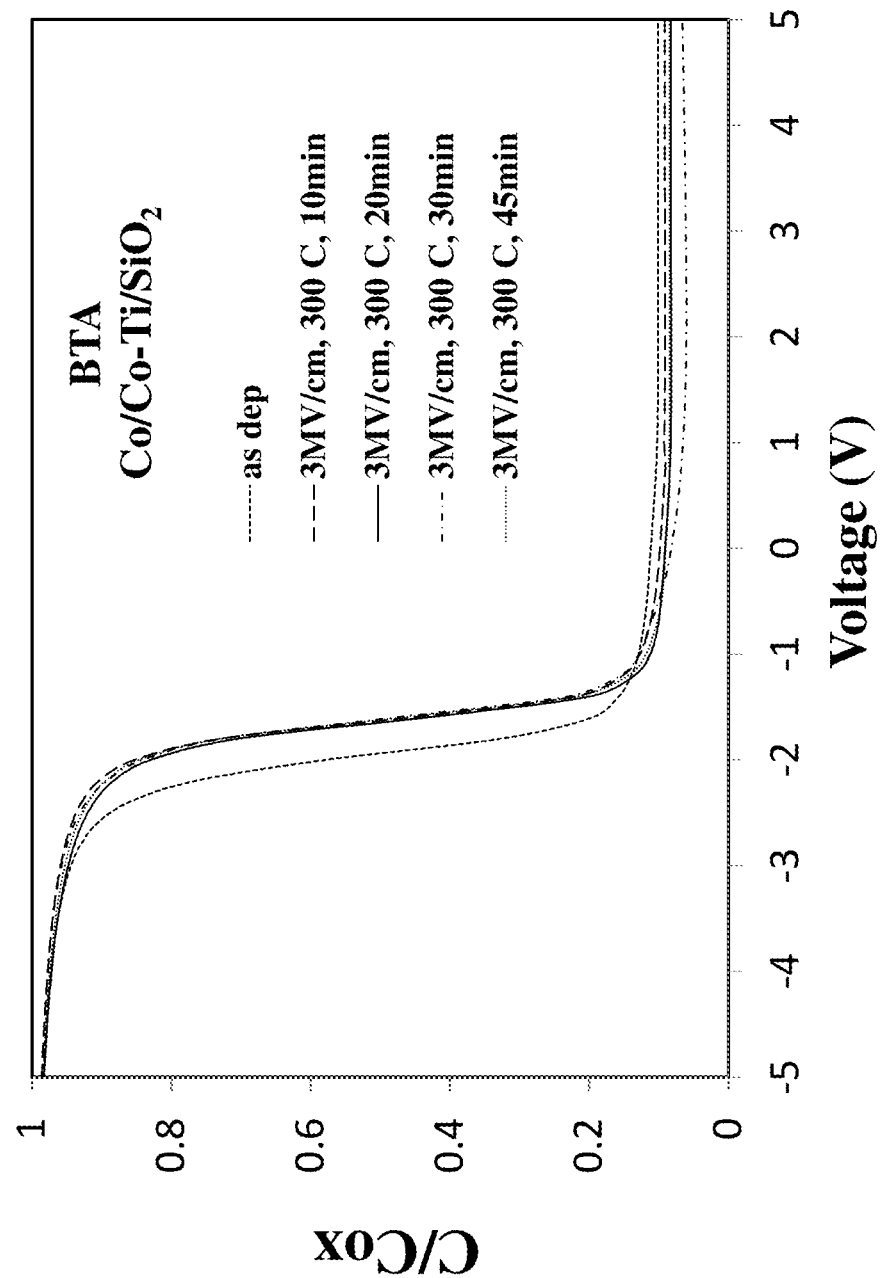
FIG. 11 shows capacitance-voltage (C-V) device measurements of as-deposited (in short "as dep" in the legend of FIG. 13), 300° C. annealed for 10 minutes, 300° C. annealed for 20 minutes, 300° C. annealed for 30 minutes, and 300° C. annealed for 45 minutes, Co/Co-Ti/$SiO_2$ structure, according to some example embodiments.

FIG. 11 shows capacitance-voltage (C-V) device curves pre and post thermal anneal. Flat band voltage of the as-deposited sample shifts slightly to a positive side post ten minutes thermal anneal. However, no further shift is observed by increasing thermal anneal time to 20 or 45 minutes. The initial shift is likely due to defect charges in oxide (SiO$_2$). No further shift post thermal anneal indicates that the metal ions of cobalt or alloying element did not diffuse into SiO$_2$. This indicates good diffusion barrier property of the cobalt alloy interface layer.

Figure 12:
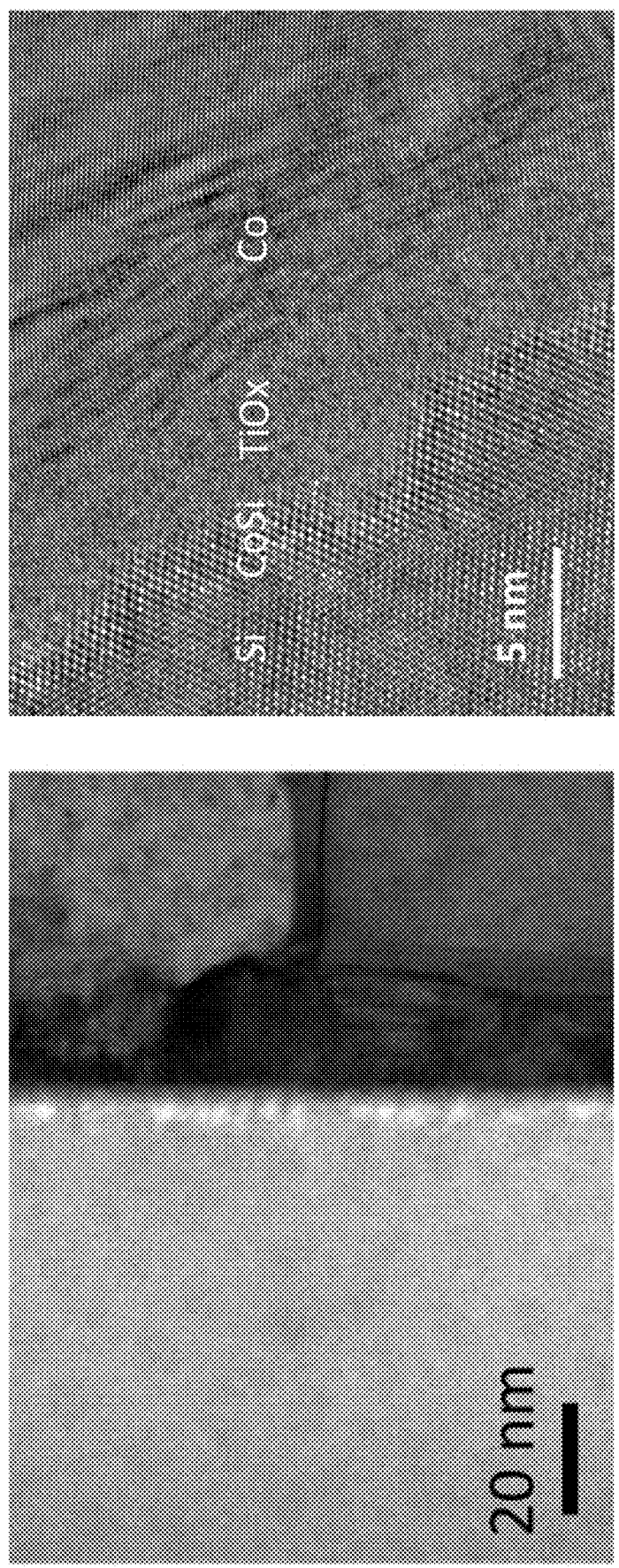
FIG. 12 shows TEM cross-sectional images (left image of 20 nm scale and right magnified image of 5 nm scale) of the barrier layer Co/Co-Ti/Si interfaced with silicon according to some example embodiments.

FIG. 12 shows cross-sectional images of the interface region between Co and Si at low and high magnification (left and right figures, respectively). The sample was annealed at 200° C. for 10 minutes. A band of a bright contrast in low magnification cross-sectional view in the left figure of FIG. 12 corresponds to the formation of titanium oxide. The magnified image (i.e. right figure of FIG. 12) shows two-layered structure of titanium oxide on the Co side and Co silicide on the Si side.

Figure 13:
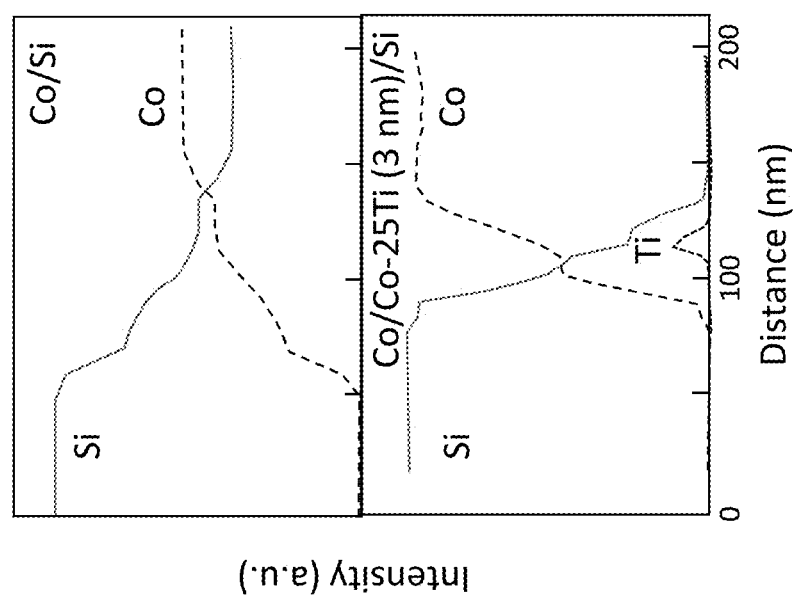
FIG. 13 shows compositional distributions of Si, Co, and Ti throughout the thickness of the cobalt alloy layer according to some example embodiments.

FIG. 13 shows compositional distributions of Si, Co, and Ti throughout the thickness of the cobalt alloy layer, indicating that Co does not penetrate to the silicon layer as the Si region does not contain any amount of Co. This shows that the cobalt alloy is a barrier layer that prevents the cobalt from penetration into the silicon layer.

Figure 14:
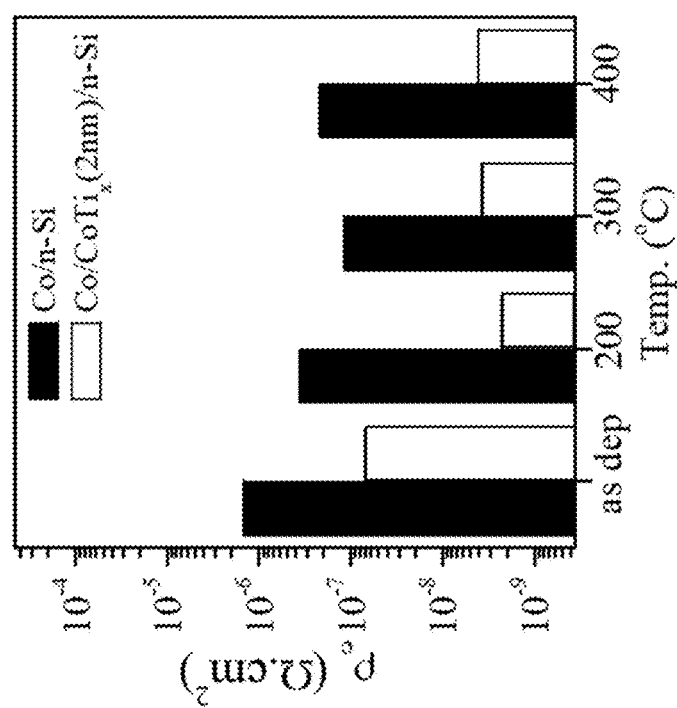
FIG. 14 shows experimental contact resistivity device data collected by resistivity measurement using Circular Transmission Line Method (CTLM) carried out on cobalt alloy of Co—Ti according to an example embodiment of the present disclosure.
Figure 15A:
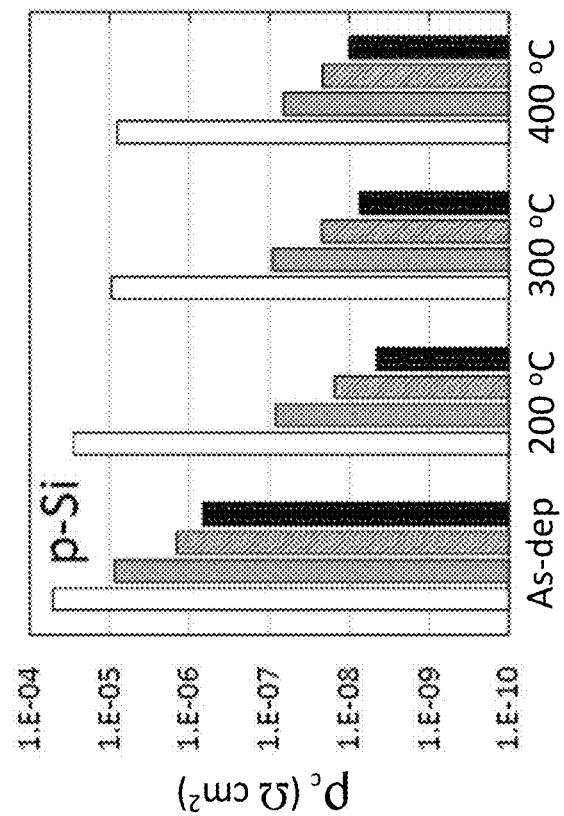
FIGS. 15(a) and 15(b) show experimental contact resistivity device data collected by resistivity measurement using Circular Transmission Line Method (CTLM) carried out on cobalt alloy of Co—Ti according to an example embodiment of the present disclosure.
Figure 15B:
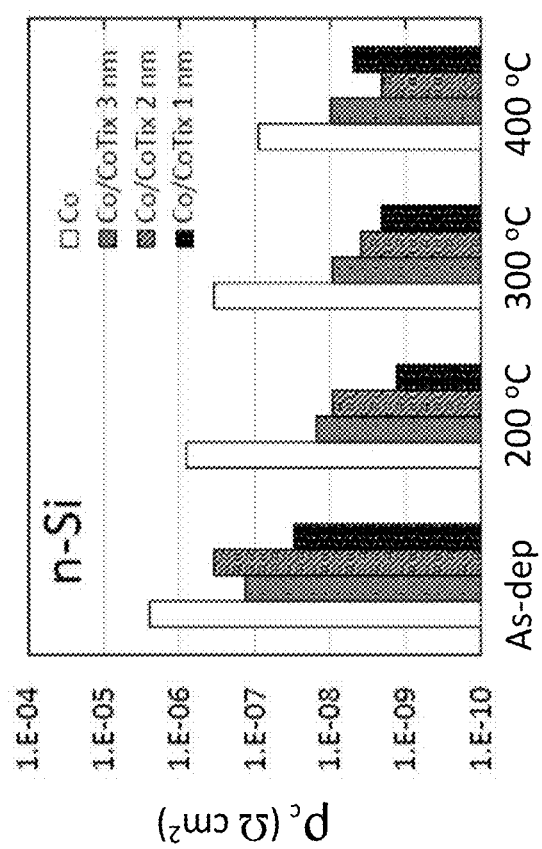

FIGS. 14, 15(a) and 15(b) show the experimental contact resistivity device data collected via Circular Transmission Line Method. It shows measured contact resistivity of Co/Si with or without the Co-(25 at. % Ti) alloy layer. The thickness of Co and Co—Ti alloy in the as-deposited state were 150 nm and 2 nm respectively. After annealing at 200° C., contact resistivity was measured at 2.4×10$^{-9}$ μΩ-cm$^2$. With increasing annealing temperature to 300° C. and further to 400° C., contact resistivity gradually increases. This increase is probably due to redistribution of phosphorous dopants from the n$^+$ region of Si to the silicide region. Depending on the initial thickness and composition of the Co—Ti alloy interface layer, different values were obtained for titanium oxide thickness, Co silicide thickness, and contact resistivity. Nevertheless, a low contact resistivity of the order of 10$^{-9}$ μΩ-cm$^2$ could be obtained when the thickness of the titanium oxide layer was in the range of 0.5 nm to 5 nm, and the Co silicide thickness was in the range of 1 nm to 10 nm.

Figure 16B:
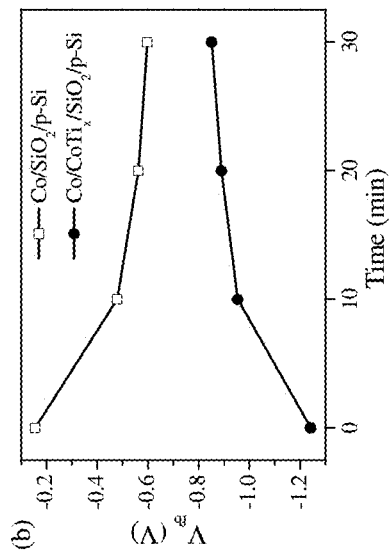
FIGS. 16(a) and 16(b) show flatband voltage value (Vfb) for MOS capacitors with Co and $Co/CoTi_x$ gate after being subjected to (a) thermal stress and (b) bias thermal stress 3 MV/cm at 250° C. according to some example embodiments.
Figure 16A:
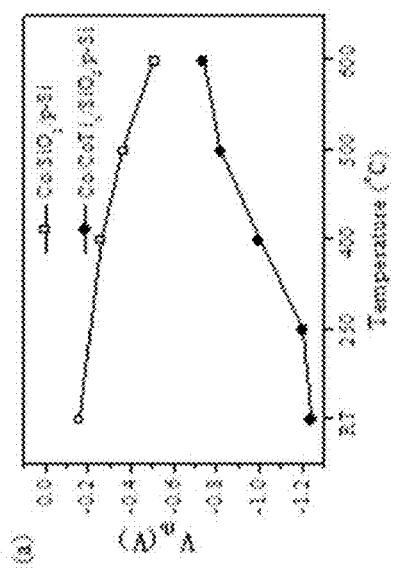

FIGS. 16(a) and 16(b) show flatband voltage value (Vfb) for MOS capacitors with Co and Co/CoTi$_x$ gate after being subjected to (a) thermal stress and (b) bias thermal stress at 3 MV/cm at 250° C. FIGS. 16(a) and 16(b) show that, at all temperatures, the structure of Co/CoTi$_x$/SiO$_2$/Si having the barrier layer of CoTi$_x$ shows positive shift of flatband voltage, while the structure of Co/SiO$_2$/Si without the barrier layer of CoTi$_x$ shows negative shift of flatband voltage. This supports the structure of Co/CoTi$_x$/SiO$_2$/Si having the barrier layer of CoTi$_x$ allows a better control of the device due to a better interface without Co metal penetration into the SiO$_2$ layer.

Figures 17A, 17B, 17C, 17D:
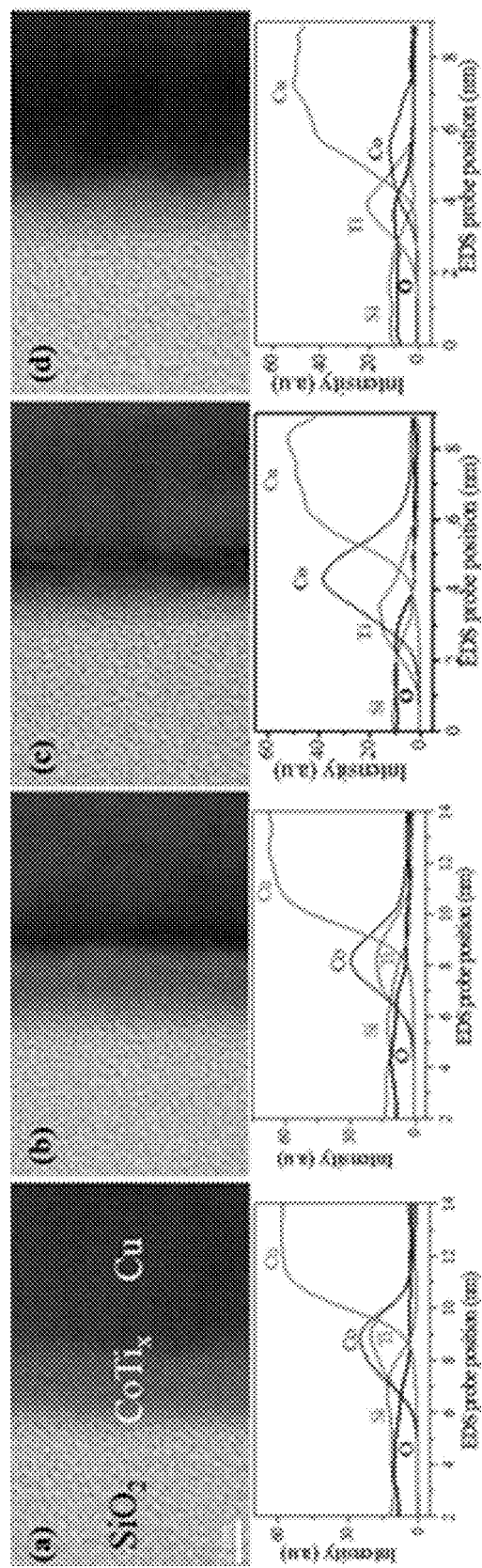
FIGS. 17(a), 17(b), 17(c), and 17(d) show the compositional distribution of the structure of $SiO_2/CoTi_x/Cu$ in as-deposited sample of FIG. 17(a), in 400° C. annealed sample of FIG. 17(b), in 500° C. annealed sample of FIG. 17(c), and in 600° C. annealed sample of FIG. 17(d) according to some example embodiments.

FIGS. 17(a), 17(b), 17(c), and 17(d) show the compositional distribution of the structure of $SiO_2/CoTi_x/Cu$ in as-deposited sample of FIG. 17(a), in 400° C. annealed sample of FIG. 17(b), in 500° C. annealed sample of FIG. 17(c), and in 600° C. annealed sample of FIG. 17(d). When using the $CoTi_x$ alloy layer with copper as a common contact metal, FIGS. 17(a), 17(b), 17(c), and 17(d) show that at all temperatures (i.e. as-deposited, 400° C. annealing, 500° C. annealing and 600° C. annealing), copper (Cu) does not penetrate through the $CoTi_x$ layer into the silicon oxide layer to deteriorate the silicon layer.

Figure 18:
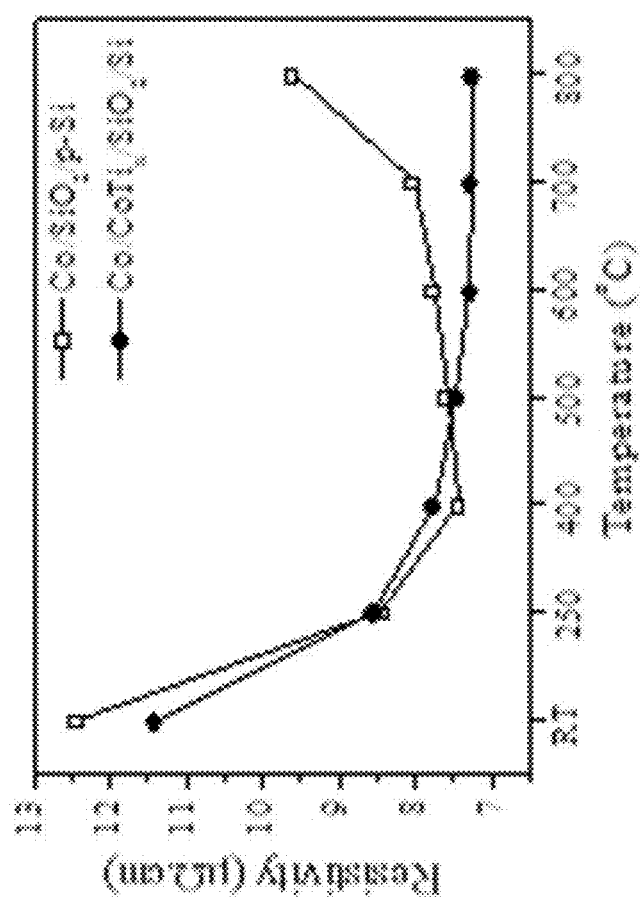
FIG. 18 show the change of resistivity with temperature of the samples having the structure of $Co/SiO_2/p$-Si and $Co/CoTi_x/SiO_2/Si$ according to some example embodiments.

FIG. 18 show the change of resistivity with temperature of the samples having the structure of $Co/SiO_2$/p-Si and $Co/CoTi_x/SiO_2$/Si. The sample having $CoTi_x$ layer generally has a lower resistivity than the structure of $Co/SiO_2$/p-Si which does not have the $CoTi_x$ layer as a barrier layer to prevent the mutual penetration between the Co metal the $SiO_2$ layer. This supports that $CoTi_x$ barrier layer benefits the structure by preventing the mutual penetration between the Co metal the $SiO_2$ layer, especially the gate spacer region and interconnect region. Also, in the high temperature region at 700-800° C., the resistivity of the structure of $Co/SiO_2$/p-Si which does not have the $CoTi_x$ layer increases dramatically, supporting the mutual penetration between the Co metal the $SiO_2$ layer at high temperature. At high temperature region at 700-800° C., the resistivity of $Co/CoTi_x/SiO_2$/Si that has a $CoTi_x$ layer maintains low without any increase of resistivity, and this supports the function of the $CoTi_x$ layer can beneficially prevent the deterioration of the Co and $SiO_2$ layers by mutual penetration.

The concrete examples are mentioned simply for the sake of explanation, not by way of limitation. It will be understood therefore that in this description, the cobalt alloy liner and/or metal cobalt is also implemented to any types of device having an interconnection. It is also within the inventive concept to use metal copper or metal tungsten is used with the combination of the cobalt alloy liner.

In FEOL 10 nm technology node, it is expected that a Fin pitch is around 34 nm and a Fin height is around 53 nm. Parasitic Extrinsic Resistance (also called Parasitic External Resistance or R-External) prevents the gains the industry has achieved in increasing charge mobility in the transistor channel to be translated into increased drive current of the MOSFET. This mobility gain determines how fast the transistor switches on and off. In other words, extrinsic resistance negates the innovations such as strain engineering, the industry has achieved to improve the channel charge mobility. Contact and silicide metallization account for over 60% of extrinsic resistance. FEOL metallization includes, Ti/TiN/W for contact and Local-Inter-Connect. Titanium (Ti) and titanium-nitride (TiN) liners' diffusion and adhesion properties allow for tungsten (W) fill of contacts and Local-Inter-Connects. Titanium Silicide (TiSi), titanium germanium Silicide (TiGeSi) for contact to PMOS and titanium silicide (TiSi), titanium carbon silicide (TiSiC) for contact to NMOS are typical metal silicide in microelectronics industry. When in contact with semiconductor source and drain, they create high barrier properties to flow of charge. The present disclosure replaces this system of metals with cobalt metal alloys liners followed by cobalt fill to reduce the barrier to flow of charge.

In FEOL 10 nm technology node, the gate pitch is expected to be around 54 nm. Metal gate is expected to have a complex stack of TaN, TiAlN, TiN and W. This system of metals adjusts the work-function of the metal for PMOS and NMOS transistors. The present disclosure replaces this system of metals with cobalt metal alloys liners followed by cobalt fill.

In MOL 10 nm technology node, contact gate pitch is reported to be at 54 nm. The contact and Local-Inter-Connect (LIC) Critical Dimension (CD) is estimated at less than 15 nm. The MOL metallization includes, Ti/TiN/W for contact and Local-Inter-Connect. High resistance titanium (Ti) and titanium-nitride (TiN) liners' diffusion and adhesion properties allow for tungsten (W) fill of contacts and Local-Inter-Connects. The present disclosure replaces this system of metals with a lower resistance cobalt metal alloys liners followed by cobalt fill. It thus creates new devices with significantly improved performance.

In BEOL 10 nm technology node, minimum metal pitch is reported at 36 nm. High resistance tantalum-nitride (TaN) and tantalum (Ta) liners are deposited to prevent subsequent copper seed and copper fill from diffusing into the adjacent low dielectric constant Inter-Layer-Dielectric. Dual-Damascene processes are implemented to etch, clean and fill with metals both vias and trenches for metal lines in one step processes. The critical dimensions of minimum pitch metal lines in 10 nm node technology is less than 20 nm. As such, the major volume of vias and trenches are filled by high resistance TaN and Ta metals as opposed to low resistance copper metal. This causes a significant increase in line resistance and thus increasing the RC signal delay of wires or circuits. The present disclosure replaces this system of metals with cobalt metal alloys liners (a two steps cobalt alloy/Co contact) thus significantly reducing the line resistance. As a result, it also reduces RC (Resistive-Capacitive) signal delay of wires or circuits of traditional copper/barrier-seed processing.

In memory technology 3-D V-NAND features 512 Gb flash memory with 64-stacked word line (WL) control gate (CG). The die size of 128.5 $mm^2$ is in production and 128-stacked WL and CG is in development. As opposed to 2-D NAND where individual cells are positioned in a plane next to each other, the 3-D V-NAND allows for a smaller footprint and higher density. It also eliminates two major bottle necks of 2-D NAND, namely cell to cell interference and limitations in patterning. Typical processing of 3-D V-NAND starts with blanket film deposition of the stacked pairs (64-stacked pairs in production and 128-stacked pairs in development) films. High aspect ratio channel, staircase and slit etch then follow. Typical channel pitches are less than 200 nm, with diameters of less than 50 nm. The aspect ratios of these structures are greater than 30:1 and 60:1 pending direction of etch. Staircase contact holes with similar dimensions but variable aspect ratios of greater than 30:1 to greater than 80:1 are processed in one step. Staircase etch also defines pads for high aspect ratio contact landing, avoiding complex additional lithography steps for contact processing. The Word Line (WL) Control Gate (CG) contacts in general utilize typical logic tungsten processing (Ti/TiN/W). Due to extreme high aspect ratios of contact holes, this process suffers from high resistance and resistance variation across the length of the contact and contact to contact. The present disclosure replaces this system of metals with cobalt metal alloys liners followed by cobalt fill or copper fill.

Embodiments of the present invention are directed to creating a new family of devices that utilize a new family of metal alloys in semiconductor industry wafer processing. Cobalt metal alloy systems are developed for applications in FEOL, MOL and BEOL semiconductor metallization interconnect processing to create devices with higher performance. In FEOL processing, a cobalt alloy layer having a thickness of less than 2 nm with correctly adjusted alloy composition enables the replacement of high net resistance Ti/TiN/W contact to source, drain and gate in favor of a lower net resistance cobalt alloy/Co contact. It further reduces the interface resistance between recessed/raised source/drain of the semiconductor device with the metal contacts. In MOL it enables the replacement of high resistance Ti/TiN/W Local-Inter-Connect in favor of a lower resistance cobalt alloy/Co. This combination reduces the External Resistance (R-External) of the device significantly, improving device speed and allowing for creation of a new family of low power devices. In BEOL processing it allows for replacement of non-scalable TaN/Ta/Copper Seed/Copper Fill processing. However, a two steps cobalt alloy/Co significantly reduces the line resistance and as a result also reduces RC (Resistive-Capacitive) signal delay of wires or circuits of traditional copper/barrier-seed processing. The present disclosure allows for creation of a new generation of in 3-D V-NAND and DRAM with significantly lower access resistance.

It should be understood that the steps of the example methods set forth herein are not necessarily required to be performed in the order described, and the order of the steps of such methods should be understood to be merely example. Likewise, additional steps may be included in such methods, and certain steps may be omitted or combined, in methods consistent with various embodiments.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "one example embodiment" or "an example embodiment" means that a particular feature, structure, or characteristic described in connection with the embodiment can be included in at least one embodiment. The appearance of the phrase "in one example embodiment" in various places in the specification do not all necessarily refer to the same embodiment, nor are separate or alternative embodiments necessarily mutually exclusive of other embodiments. The same applies to the term "implementation" and variations of that term.

As used in this application, the word "example" is used herein to mean serving as an example, instance, or illustration. Any aspect or design described herein as "example" or "exemplary" is not necessarily to be construed as preferred or advantageous over other aspects or designs. Rather, use of the word is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Although the elements in any following method claims are recited in a particular sequence, unless the claim recitations otherwise imply a particular sequence for implementing some or all of those elements, those elements are not necessarily intended to be limited to being implemented in that particular sequence.

No claim element herein is to be construed under the provisions of 35 U.S.C. § 112(f), unless the element is expressly recited using the phrase "means for" or "step for."

It will be further understood that various changes in the details, materials, and arrangements of the parts which have been described and illustrated in order to explain the nature of described embodiments may be made by those skilled in the art without departing from the scope as expressed in the following claims.

What is claimed is:

1. A semiconductor device, comprising:
    a substrate;
    a conductive wiring which comprises cobalt or copper and is electrically connected to the substrate;
    an insulating material which electrically isolates the conductive wiring from neighboring wiring;
    a first barrier layer which (i) comprises a first cobalt alloy which comprises cobalt and at least one of hafnium (Hf), tantalum (Ta) and titanium (Ti) and (ii) is disposed between the conductive wiring and the insulating material; and
    a second barrier layer which includes a second cobalt alloy and is disposed between the conductive wiring and the substrate;
    wherein the first barrier layer separates the conductive wiring from a gate electrode, and
    wherein both the first barrier layer and the second barrier layer are in contact with the conductive wiring.

2. The semiconductor device according to claim 1, wherein the conductive wiring comprises cobalt.

3. The semiconductor device according to claim 2, wherein the first cobalt alloy comprises cobalt and titanium (Ti).

4. The semiconductor device according to claim 1, wherein at least one of the first barrier layer and the second barrier layer comprises an amorphous structure.

5. The semiconductor device according to claim 1, wherein at least one of the first barrier layer and the second barrier layer further comprises at least one of silicon (Si), carbon (C), nitrogen (N) and oxygen (O) in addition to cobalt.

6. The semiconductor device according to claim 1, wherein:
    the first barrier layer comprises at least one of hafnium (Hf), tantalum (Ta) and titanium (Ti) and at least one of silicon (Si), carbon (C), nitrogen (N) and oxygen (O), and
    the second barrier layer comprises cobalt and at least one of silicon, SiGe, SiC and InGaAs.

7. The semiconductor device according to claim 1, wherein the second barrier layer is formed of cobalt silicide having a crystalline structure and an epitaxial crystallographic relationship to the substrate.

8. The semiconductor device according to claim 2, wherein a thickness of the first barrier layer ranges from 1 nm to 30 nm.

9. The semiconductor device according to claim 1, wherein the second barrier layer comprises at least one of hafnium oxide, tantalum oxide and titanium oxide and has an amorphous structure.

10. The semiconductor device according to claim 1, wherein a thickness of the second barrier layer ranges from 0.5 nm to 5 nm.

11. The semiconductor device according to claim 1, wherein the second barrier layer comprises carbon.

12. A FinFET transistor comprising a semiconductor device of claim 1 and including a source contact and a drain contact, wherein the source contact and the drain contact each comprise the conductive wiring and the first barrier layer of the semiconductor device.

13. The semiconductor device according to claim 1, wherein a sidewall spacer is present between the first barrier layer and the gate electrode.

14. The semiconductor device according to claim 13, wherein the sidewall spacer comprises one or more materials selected from the group consisting of $Si_3N_4$, SiON, SiCN, SiCO, and SiOCN.

15. The semiconductor device according to claim 1, wherein the first barrier layer consists of cobalt and at least one of hafnium (Hf), tantalum (Ta) and titanium (Ti) and optionally at least one of silicon (Si), carbon (C), nitrogen (N) and oxygen (O), and the second barrier layer consists of cobalt and at least one of silicon, SiGe, and SiC.

16. The semiconductor device according to claim 1, wherein the first barrier layer consists of cobalt and at least one of hafnium (Hf), tantalum (Ta) and titanium (Ti) and at least one of silicon (Si), carbon (C), nitrogen (N) and oxygen (O), and the second barrier layer consists of cobalt and at least one of silicon, SiGe, and SiC.

17. The semiconductor device according to claim 1, wherein the second cobalt alloy comprises at least one of silicon (Si), carbon (C), and oxygen (O) in addition to cobalt.

\* \* \* \* \*